US012094760B2

(12) United States Patent
Ritter et al.

(10) Patent No.: US 12,094,760 B2
(45) Date of Patent: Sep. 17, 2024

(54) HIGH-TRANSPARENCY SEMICONDUCTOR-METAL INTERFACES

(71) Applicant: International Business Machines Corporation, Armonk, NY (US)

(72) Inventors: Markus Fabian Ritter, Adliswil (CH); Fabrizio Nichele, Zurich (CH); Heinz Schmid, Waedenswil (CH); Heike Erika Riel, Baech (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

(21) Appl. No.: 17/089,136

(22) Filed: Nov. 4, 2020

(65) Prior Publication Data

US 2022/0139770 A1     May 5, 2022

(51) Int. Cl.
| | |
|---|---|
| *H01L 21/76* | (2006.01) |
| *H01L 21/311* | (2006.01) |
| *H01L 21/762* | (2006.01) |

(52) U.S. Cl.
CPC .. *H01L 21/76264* (2013.01); *H01L 21/31105* (2013.01)

(58) Field of Classification Search
CPC ......... H01L 21/76264; H01L 21/31105; H01L 21/02488; H01L 21/02546; H01L 39/22; H01L 21/02645; H01L 39/228; H01L 39/24; H01L 39/2416

See application file for complete search history.

(56) References Cited

U.S. PATENT DOCUMENTS

| | | | |
|---|---|---|---|
| 4,758,534 A | 7/1988 | Derkits, Jr. et al. | |
| 5,032,538 A | 7/1991 | Bozler et al. | |
| 9,577,177 B1 | 2/2017 | Brown et al. | |
| 9,768,251 B2 | 9/2017 | Borg et al. | |
| 9,865,795 B1 | 1/2018 | Denis | |
| 10,847,424 B2* | 11/2020 | Tapily ............. | H01L 21/823462 |
| 10,923,348 B2* | 2/2021 | Miyazoe .......... | H01L 21/02181 |
| 11,088,312 B2* | 8/2021 | Schueffelgen ....... | H01L 39/025 |
| 11,107,965 B2* | 8/2021 | Holmes ................... | H01L 27/18 |
| 11,107,966 B2* | 8/2021 | Holmes ................. | G06N 10/00 |

(Continued)

OTHER PUBLICATIONS

Kjaergaard et al., "Transparent Semiconductor-Superconductor Interface and Induced Gap in an Epitaxial Heterostructure Josephson Junction," arXiv:1607.04164v2 [cond-mat.mes-hall], Aug. 5, 2016, 8 pages.

(Continued)

*Primary Examiner* — Mohammed Shamsuzzaman
(74) *Attorney, Agent, or Firm* — Amin, Turocy & Watson, LLP

(57) ABSTRACT

Techniques that can facilitate high-transparency semiconductor-metal interfaces are provided. In one example, a method can comprise forming a silicon on insulator (SOI) over a wafer. The method can further comprise depositing a metal on the SOI. The method can further comprise forming a structure by dry-etching the metal and dry-etching the SOI. The method can further comprise forming a template over the structure. The method can further comprise etching a portion of the SOI for removal under the metal. The method can further comprise growing a semiconductor where the portion of SOI was removed.

16 Claims, 29 Drawing Sheets

(56) References Cited

U.S. PATENT DOCUMENTS

| | | | | |
|---|---|---|---|---|
| 2004/0253792 A1* | 12/2004 | Cohen | .................. | H01L 21/84 |
| | | | | 257/E21.633 |
| 2013/0277713 A1* | 10/2013 | Chyi | ................ | H01L 21/02502 |
| | | | | 257/190 |
| 2017/0104058 A1* | 4/2017 | Borg | ................ | H01L 29/66356 |
| 2020/0287120 A1* | 9/2020 | Pikulin | ............ | H01L 21/02546 |

OTHER PUBLICATIONS

Kobayashi et al., "Selective-Area Growth of InAs Nanowires with Metal/Dielectric Composite Mask and Their Application to Vertical Surrounding-Gate Field-Effect Transistors," Applied Physics Express 6 (2013) 045001, 5 pages.

Lutchyn et al., "Majorana zero modes in superconductor-semiconductor heterostructures," Nature Reviews Materials vol. 3, May 2018, 17 pages.

International Search Report and Written Opinion received for PCT Application Serial No. PCT/EP2021/074373 dated Dec. 20, 2021, 12 pages.

Schmid H. et al., "Template-assisted selective epitaxy of III-V nanoscale devices for co-planar heterogeneous integration with Si", Applied Physics Letters, American Institute of Physics, XP012198042, vol. 106, No. 23, Jun. 8, 2015, 14 pages.

Ritter M. F. et al., "Semiconductor Epitaxy in Superconducting Templates", Nano Letters, vol. 21, XP055869793, Nov. 18, 2021, pp. 9922-9929, 8 pages.

Examination report No. 1 received for Australian Patent Application Serial No. 2021376527 dated Jan. 11, 2024, 3 pages.

Request for the Submission of an Opinion for KR Application No. 10-2023-7014126 dated Jul. 8, 2024.

* cited by examiner

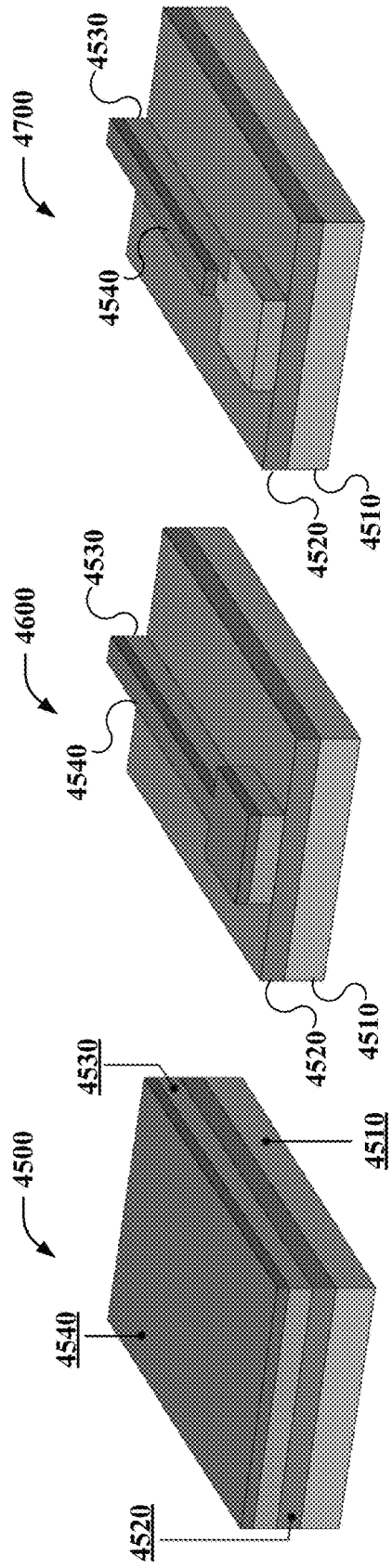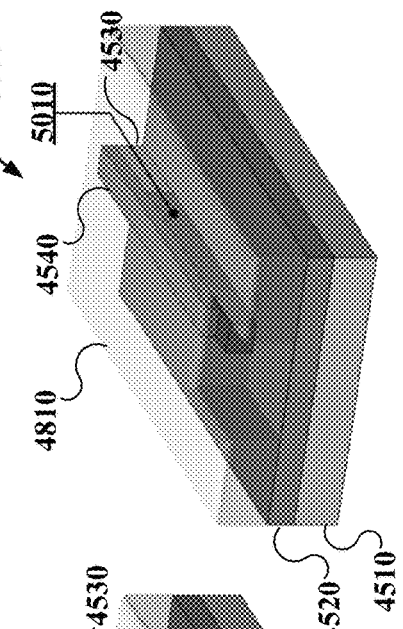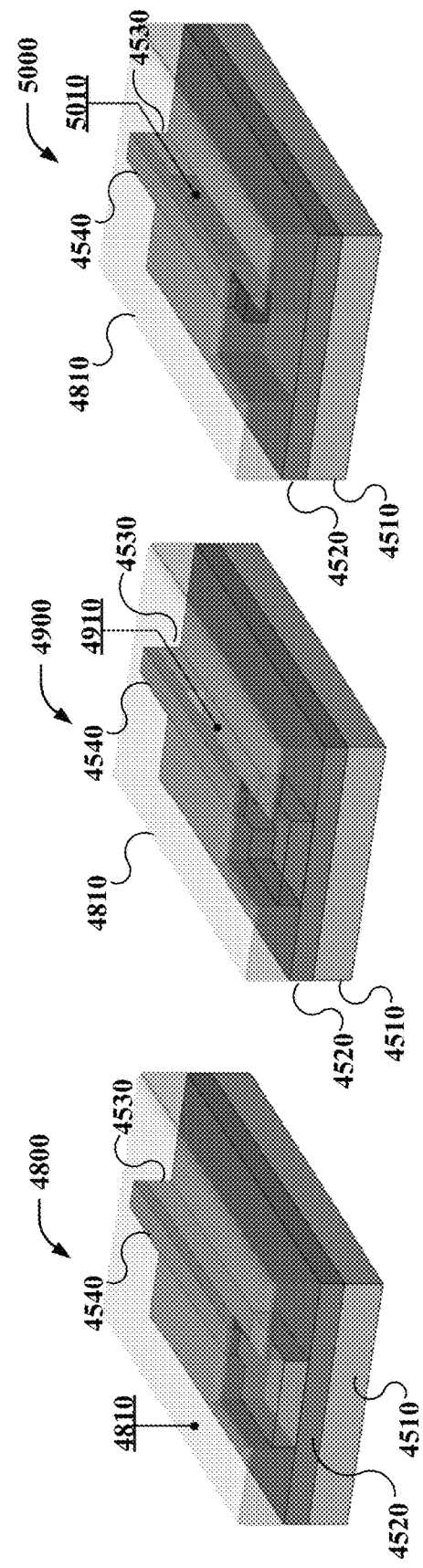
FIG. 45  FIG. 46  FIG. 47
FIG. 48  FIG. 49  FIG. 50

HIGH-TRANSPARENCY SEMICONDUCTOR-METAL INTERFACES

STATEMENT REGARDING FEDERALLY SPONSORED RESEARCH OR DEVELOPMENT

This invention was made with government support under 140D6318C0028 awarded by Defense Advanced Research Projects Agency (DARPA). The government has certain rights to this invention.

BACKGROUND

The subject disclosure relates to semiconductor devices, and more specifically, to techniques of facilitating high-transparency semiconductor-metal interfaces.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that can facilitate high-transparency semiconductor-metal interfaces are described.

According to an embodiment, a method can comprise forming a silicon on insulator (SOI) over a wafer. The method can further comprise depositing a metal on the SOI. The method can further comprise forming a structure by dry-etching the metal and dry-etching the SOI. The method can further comprise forming a template over the structure. The method can further comprise etching a portion of the SOI for removal under the metal. The method can further comprise growing a semiconductor where the portion of SOI was removed.

According to another embodiment, a method can comprise forming a template structure comprising a metal element and a silicon element by etching a portion of the silicon element for removal. The method can further comprise creating an interface between the metal element and a semiconductor by growing the semiconductor where the portion of the silicon element was removed.

According to another embodiment, a method can comprise forming a cavity structure including a first side wall comprising a metal element and a second sidewall comprising a silicon element. The method can further comprise growing a semiconductor within the cavity structure using the silicon element as a nucleation seed to form an interface between the metal element and the semiconductor.

DESCRIPTION OF THE DRAWINGS

FIG. 45 illustrates a cross-sectional view of an example, non-limiting device that can facilitate high-transparency semiconductor-metal interfaces, in accordance with one or more embodiments described herein.

FIG. 46 illustrates a cross-sectional view of the example, non-limiting device of FIG. 45 after etching metal and silicon of the device of FIG. 45, in accordance with one or more embodiments described herein.

FIG. 47 illustrates a cross-sectional view of the example, non-limiting device of FIG. 46 after etching the metal of the device of FIG. 46, in accordance with one or more embodiments described herein.

FIG. 48 illustrates a cross-sectional view of the example, non-limiting device of FIG. 47 after forming a dielectric over the metal and silicon of the device of FIG. 47, in accordance with one or more embodiments described herein.

FIG. 49 illustrates a cross-sectional view of the example, non-limiting device of FIG. 48 after etching a portion of the silicon for removal under the metal of the device of FIG. 48, in accordance with one or more embodiments described herein.

FIG. 50 illustrates a cross-sectional view of the example, non-limiting device of FIG. 49 after growing a semiconductor where the portion of the silicon was removed from the device of FIG. 49, in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

FIGS. 1-6 illustrate an example, non-limiting multi-step fabrication sequence that can be implemented to fabricate one or more embodiments of the present disclosure described herein and/or illustrated in the figures. For example, the non-limiting multi-step fabrication sequence illustrated in FIGS. 1-6 can be implemented to fabricate a device 1510 comprising a high-transparency, semiconductor-metal interface depicted in the scanning electron microscope (SEM) micrograph 1500 of FIG. 15.

Figure 1:
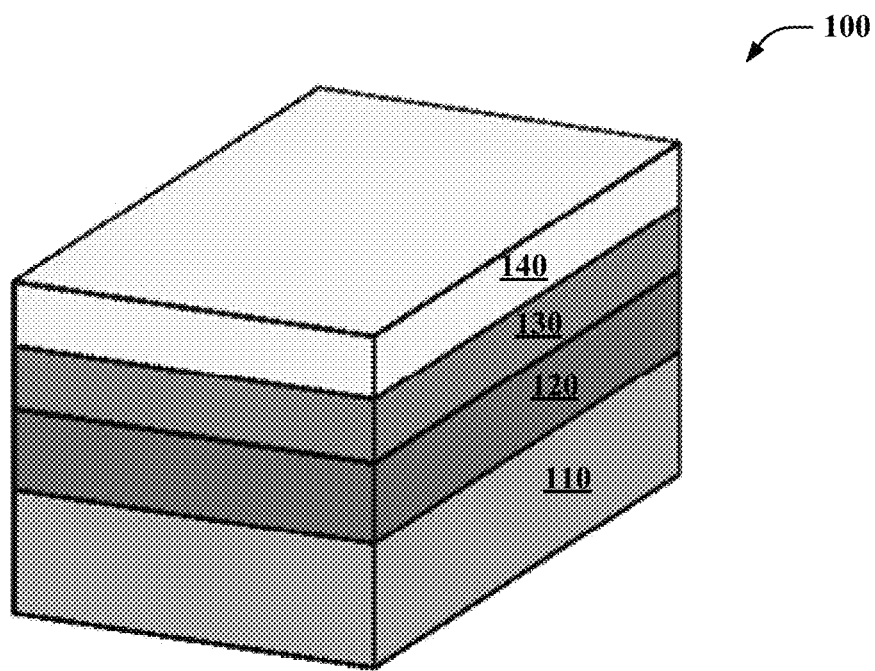
FIG. 1 illustrates a cross-sectional view of an example, non-limiting device that can facilitate high-transparency semiconductor-metal interfaces, in accordance with one or more embodiments described herein.

FIG. 1 illustrates a cross-sectional view of an example, non-limiting device 100 that can facilitate high-transparency semiconductor-metal interfaces, in accordance with one or more embodiments described herein. As shown in FIG. 1, device 100 can comprise a substrate 110. Substrate 110 can comprise any material having semiconductor properties including, but not limited to, silicon (Si), silicon-germanium (SiGe), silicon-germanium-carbon (SiGeC), silicon carbide (SiC), germanium (Ge) alloys, and the like. In an embodiment, substrate 110 can comprise a layered semiconductor including, but not limited to, silicon/silicon-germanium (Si/SiGe), silicon/silicon carbide (Si/SiC), and the like.

Device 100 can further comprise a dielectric layer 120 formed over substrate 110. Dielectric layer 120 can comprise any material having dielectric properties including, but not limited to, silicon dioxide ($SiO_2$), silicon nitride ($Si_3N_4$), hafnium oxide ($HfO_2$), aluminum oxide ($Al_2O_3$), and other materials having dielectric properties. In an embodiment, dielectric layer 120 can be a buried oxide (BOX) layer. In an embodiment, the BOX layer can be grown thermally or can be obtained via ion implantation. In an embodiment, dielectric layer 120 can be grown or formed via atomic layer deposition (ALD), plasma-enhanced chemical vapor deposition (PECVD), tetraethyl orthosilicate (TEOS), and the like. In an embodiment, dielectric layer 120 can comprise any combination of a BOX layer and one or more dielectric layers grown or formed via ALD, PECVD, TEOS, and the like. Dielectric layer 120 can comprise a thickness (e.g., height) of approximately 150 nm.

Device 100 can further comprise a silicon layer 130 formed over dielectric layer 120. Silicon layer 130 can comprise: a silicon-on-insulator (SOI) layer, a polycrystalline silicon layer, or a combination thereof. In an embodiment, silicon layer 130 can comprise a thickness (e.g., height) ranging from approximately 30 nm to approximately 70 nm. In an embodiment, substrate 110, dielectric layer 120, and silicon layer 130 form a SOI wafer.

Device 100 can further comprise a metal layer 140 formed over silicon layer 130. Metal layer 140 can comprise: titanium nitride (TiN), a non-superconductor, a superconductor, a ferromagnetic metal, or a combination thereof. In an embodiment, metal layer 140 can be grown or formed over silicon layer 130 via physical vapor deposition (PVD). In an embodiment, a $SiO_2$ layer is grown or formed on silicon layer 130 prior to forming metal layer 140 over silicon layer 130. In an embodiment, a surface of silicon layer 130 is cleaned prior to forming metal layer 140 using: a piranha solution, an oxygen plasma ($O_2$ plasma), or a combination thereof. Metal layer 140 can comprise a thickness (e.g., height) of approximately 25 nm.

Figure 2:
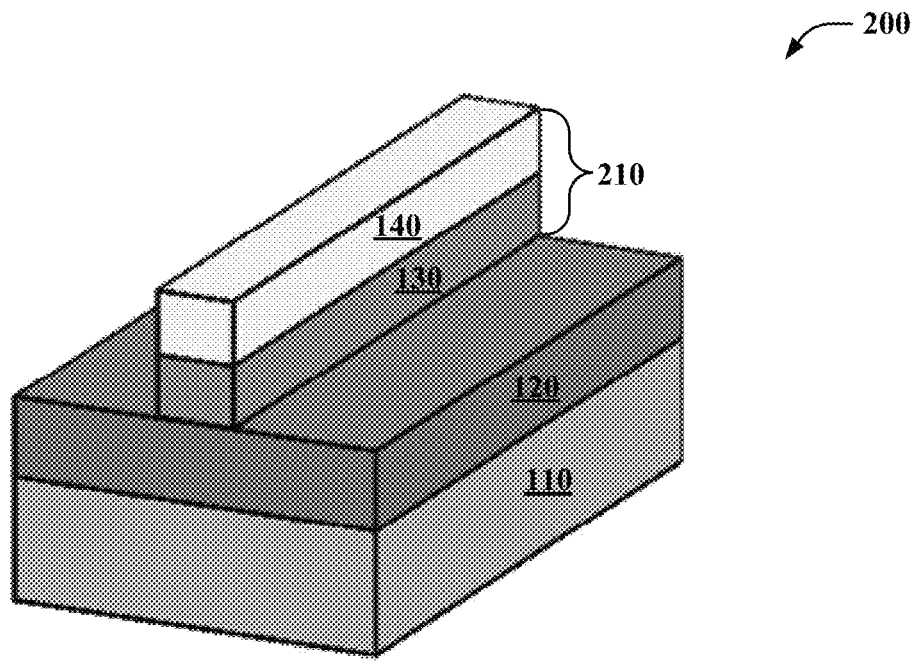
FIG. 2 illustrates a cross-sectional view of the example, non-limiting device of FIG. 1 after removing portions of a metal layer and a silicon layer, in accordance with one or more embodiments described herein.

FIG. 2 illustrates a cross-sectional view of the example, non-limiting device 100 of FIG. 1 after removing portions of metal layer 140 and silicon layer 130, in accordance with one or more embodiments described herein. Device 200 can comprise an example, non-limiting alternative embodiment of device 100 after removing portions of metal layer 140 and silicon layer 130 to form a structure 210. In an embodiment, a layer can be referred to as an element after removing a portion of the layer. For example, silicon layer 130 can be referred to as a silicon element 130 after removing a portion of silicon layer 130 to form structure 210. As another example, metal layer 140 can be referred to as metal element 140 after removing a portion of metal layer 140 to form structure 210. In an embodiment, the portions of metal layer 140 and silicon layer 130 can be removed from device 100 using dry-etching. In an embodiment, the dry-etching can be implemented using inductively coupled plasma (ICP) with hydrogen bromide (HBr). In an embodiment, removing the portions of metal layer 140 and silicon layer 130 from device 100 can comprise electron beam lithography (EBL) patterning using Hydrogen silsesquioxane (HSQ) as a negative resist.

In an embodiment, the HSQ resist can be stripped from device 200 using diluted hydrofluoric acid (dHF). In an embodiment, an adhesion layer can be formed on device 200 by using ALD to deposit $SiO_2$ over device 200. In an embodiment, the adhesion layer can comprise a thickness (e.g., height) of approximately 5 nm. In an embodiment, dielectric layer 120 serves as an etch stop layer while removing the portions of metal layer 140 and silicon layer 130 from device 100. In an embodiment, portions of metal layer 140 and silicon layer 130 are removed from device 100 in separate steps to form device 200. In an embodiment, portions of metal layer 140 and silicon layer 130 are removed from device 100 in a single step to form device 200. In an embodiment, removing portions of metal layer 140 and silicon layer 130 form device 100 in a single step forms a self-aligned structure.

Figure 3:
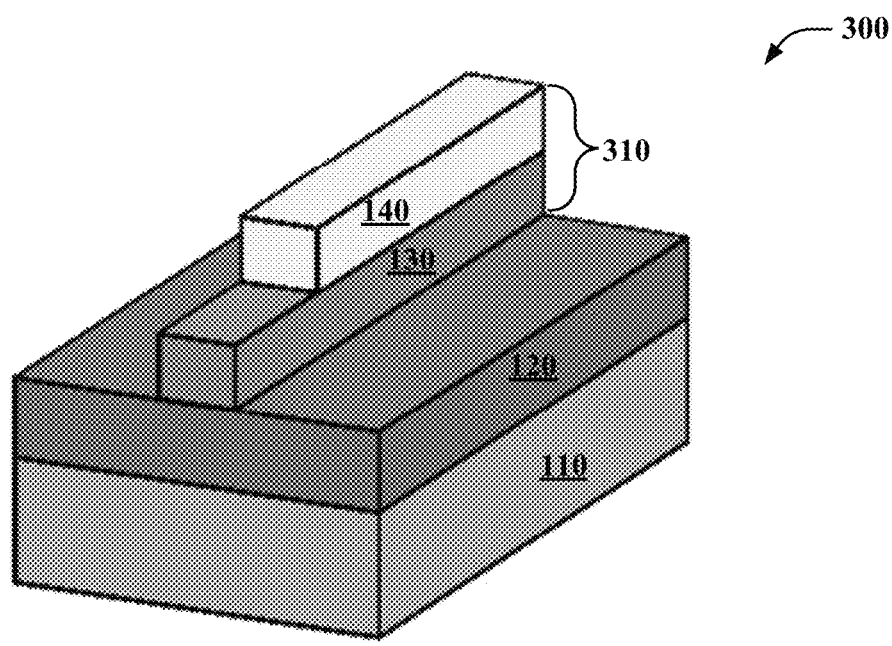
FIG. 3 illustrates a cross-sectional view of the example, non-limiting device of FIG. 2 after removing another portion of the metal layer, in accordance with one or more embodiments described herein.

FIG. 3 illustrates a cross-sectional view of the example, non-limiting device of FIG. 2 after removing a portion of metal layer 140 from structure 210 of device 200, in accordance with one or more embodiments described herein. Device 300 can comprise an example, non-limiting alternative embodiment of device 200 after removing a portion of metal layer 140 from structure 210 to form a structure 310. In an embodiment, the portion of metal layer 140 can be removed from structure 210 using selective etching. In an embodiment, the portion of metal layer 140 can be removed from structure 210 by etching the portion of metal layer 140 in a $H_2O/H_2O_2/NH_4OH$ 5:2:1 solution at 65 degrees Celsius (° C.). In an embodiment, removing the portion of metal layer 140 from structure 210 can comprise EBL patterning using chemical semi-amplified resist (CSAR) as a positive resist. In an embodiment, a $SiO_2$ adhesion layer can be removed from device 300 by etching the $SiO_2$ adhesion layer with buffered hydrofluoric acid (BHF).

Figure 4:
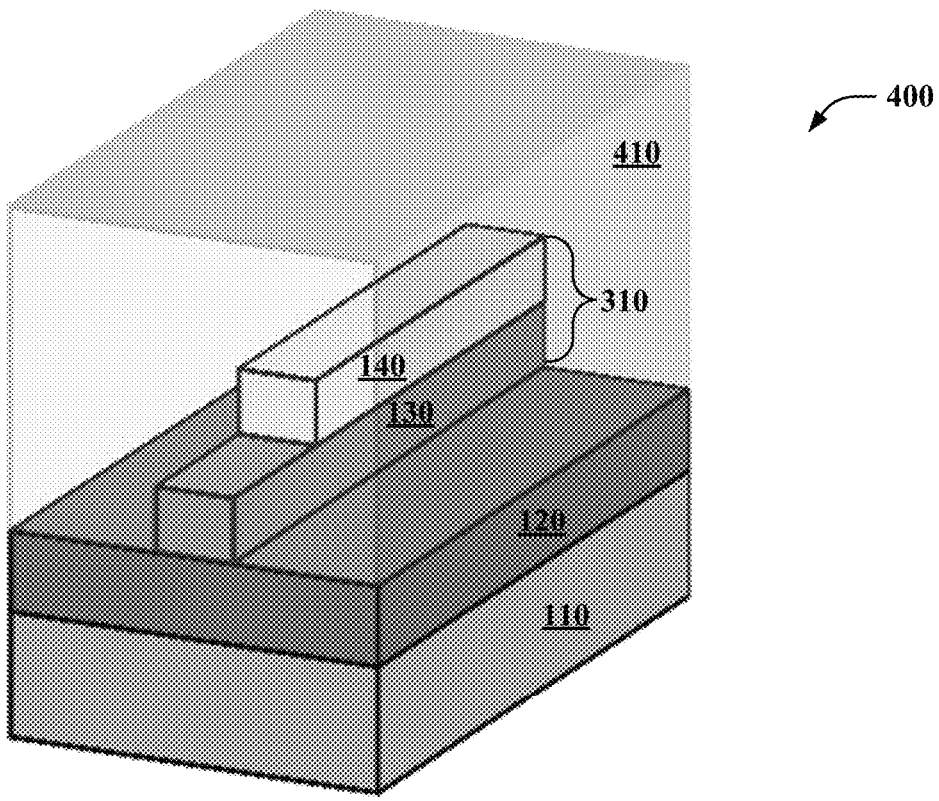
FIG. 4 illustrates a cross-sectional view of the example, non-limiting device of FIG. 3 after forming a dielectric layer on the device of FIG. 3, in accordance with one or more embodiments described herein.

FIG. 4 illustrates a cross-sectional view of the example, non-limiting device of FIG. 3 after forming a dielectric layer on the device 300, in accordance with one or more embodiments described herein. Device 400 can comprise an example, non-limiting alternative embodiment of device 300 formed by growing or forming a dielectric layer 410 over device 300. Dielectric layer 410 can comprise any material having dielectric properties including, but not limited to, silicon dioxide ($SiO_2$), silicon nitride ($Si_3N_4$), hafnium oxide ($HfO_2$), aluminum oxide ($Al_2O_3$), and other materials having dielectric properties. In an embodiment, dielectric layer 410 can comprise a thickness (e.g., height) of approximately 40 nm. In an embodiment, dielectric layer 410 can be formed on device 300 by using ALD to deposit $SiO_2$ over device 300. In an embodiment, a CSAR layer can be stripped from device 300 prior to forming dielectric layer 410 on device 300. In an embodiment, dielectric layer 410 serves as a template for growth of a semiconductor. In an embodiment, dielectric layer 410 forms a template over structure 310. In an embodiment, the template determines a geometry of the semiconductor.

Figure 5:
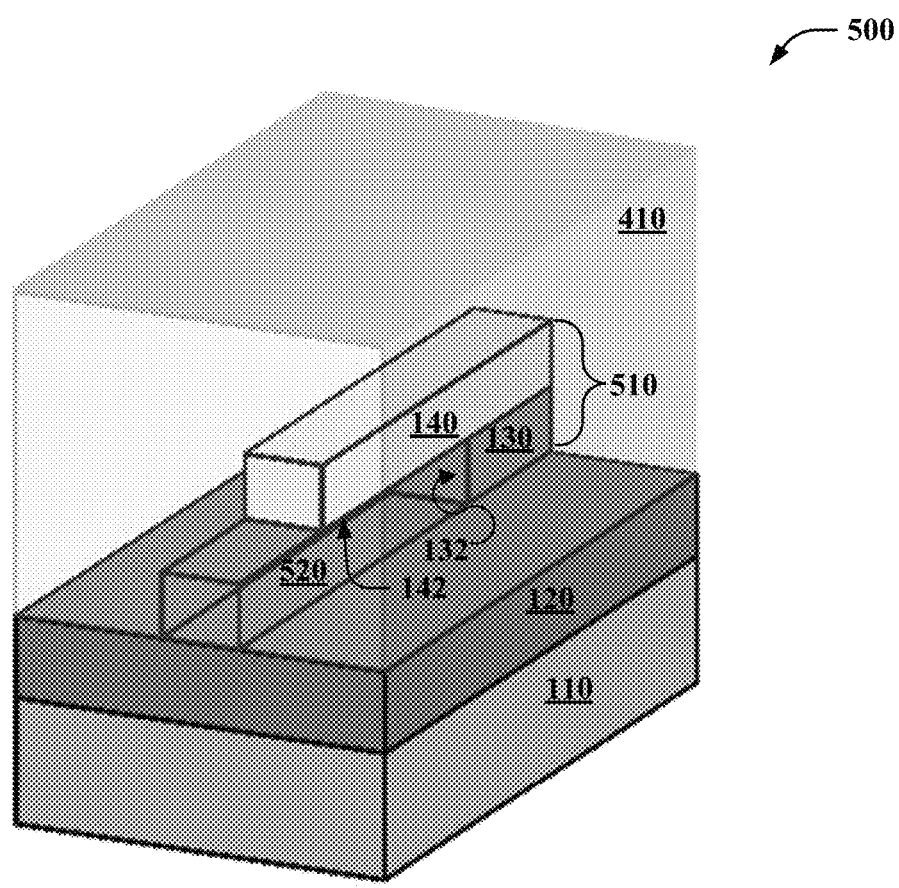
FIG. 5 illustrates a cross-sectional view of the example, non-limiting device of FIG. 4 after etching a portion of the silicon layer for removal under the metal layer, in accordance with one or more embodiments described herein.

FIG. 5 illustrates a cross-sectional view of the example, non-limiting device of FIG. 4 after etching a portion 520 of silicon layer 130 for removal under metal layer 140, in accordance with one or more embodiments described herein. Device 500 can comprise an example, non-limiting alternative embodiment of device 400 formed by etching portion 520 of silicon layer 130 from structure 310 to form structure 510. In an embodiment, structure 510 is a template structure. In an embodiment, the template structure further comprises dielectric layer 410. In an embodiment, portion 520 of silicon layer 130 is etched for removal using tetramethyl ammonium hydroxide (TMAH), xenon difluoride (XeF$_2$) gas, or hot hydrochloric acid (HCl) vapor. In an embodiment, portion 520 of silicon layer 130 is etched for removal using 2% TMAH at 80° C. In an embodiment, silicon layer 130 is exposed using a hydrofluoric acid etch prior to etching portion 520 of silicon layer 130 for removal. In an embodiment, a residual portion of silicon layer 130 that remains after etching portion 520 can provide a nucleation seed from which growth of a semiconductor (e.g., semiconductor 620 of FIG. 6) can commence.

In an embodiment, etching portion 520 of silicon layer 130 for removal can comprise EBL patterning using CSAR as a positive resist. In an embodiment, portion 520 of silicon layer 130 can be locally exposed prior to removal by generating an opening in the template that dielectric layer 410 forms over structure 310 using the EBL patterning. In an embodiment, portion 520 of silicon layer 130 can be locally exposed prior to removal by locally etching one or more holes in the template that dielectric layer 410 forms over structure 310 using dry-etching (e.g., reactive-ion etching (RIE), etching implemented using ArCHF$_3$ as the etchant gas, and the like), wet-etching (e.g., BHF etching and the like), or a combination thereof. In an embodiment, metal layer 140 can be protected while portion 520 of silicon layer 130 is being etched for removal by an adhesion layer comprising SiO$_2$ overlaying metal layer 140. In an embodiment, the adhesion layer can comprise a thickness (e.g., height) of approximately 5 nm.

Figure 6:
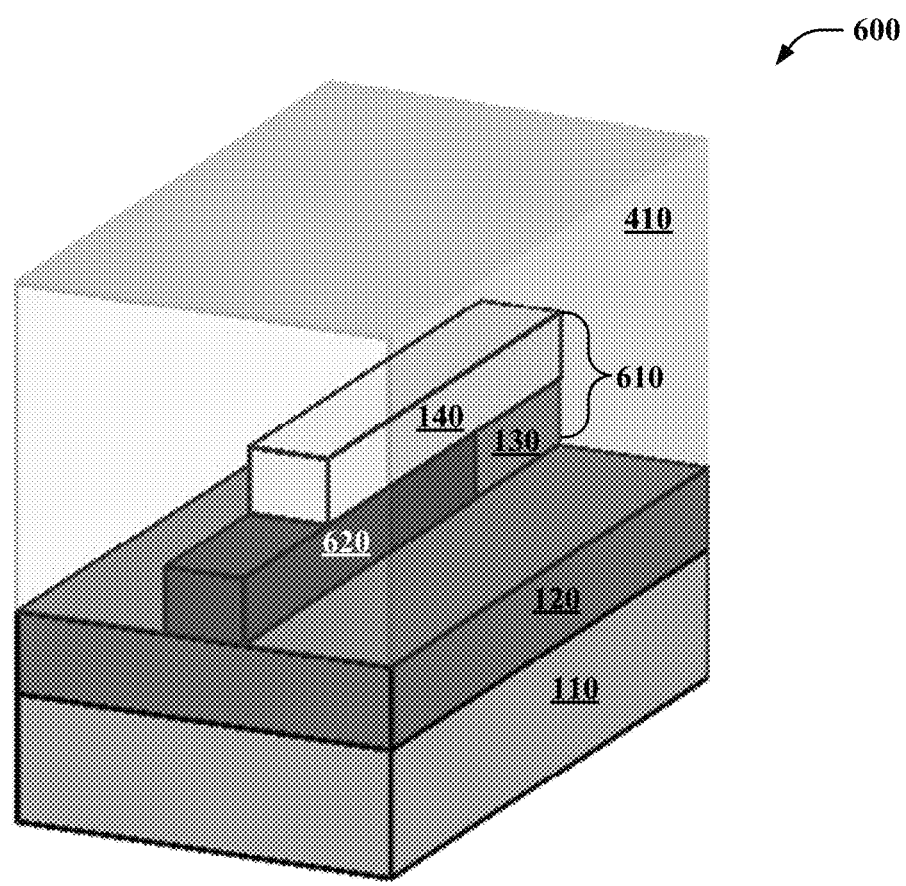
FIG. 6 illustrates a cross-sectional view of the example, non-limiting device of FIG. 5 after growing a semiconductor where the portion of the silicon layer was removed, in accordance with one or more embodiments described herein.

FIG. 6 illustrates a cross-sectional view of the example, non-limiting device of FIG. 5 after growing a semiconductor 620 where portion 520 of silicon layer 130 was removed, in accordance with one or more embodiments described herein. Device 600 can comprise an example, non-limiting alternative embodiment of device 500 formed by growing a semiconductor 620 where portion 520 of silicon layer 130 was removed from structure 510 to form structure 610. In an embodiment, semiconductor 620 is grown via metal organic chemical vapor deposition (MOCVD) or metal-organic vapor phase epitaxy (MOVPE). In an embodiment, semiconductor 620 comprises indium arsenide (InAs). In an embodiment, semiconductor 620 is a group III-V semiconductor. In an embodiment, a high-transparency interface between metal layer 140 and semiconductor 620 is formed in situ during growth of semiconductor 620. In an embodiment, dHF wet-etching is performed prior to growing semiconductor 620 to remove native SiO$_2$ from a nucleation seed provided by a residual portion of silicon layer 130 in structure 510 and/or to expose features of metal layer 140 in structure 510. In an embodiment, growing semiconductor 620 comprises tuning growth conditions for: an aspect ratio of a template structure, crystal growth direction, segment geometry of metal layer 140 within structure 510, or a combination thereof.

Figure 7:
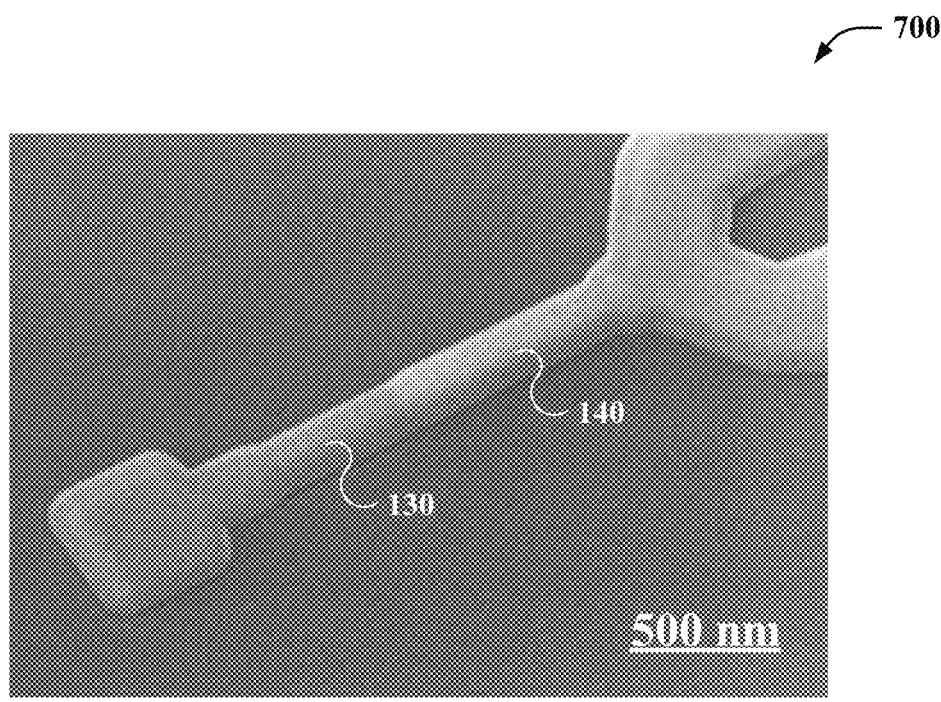
FIG. 7 illustrates an example, non-limiting top-view scanning electron microscope (SEM) micrograph depicting the device of FIG. 4, in accordance with one or more embodiments described herein.

FIG. 7 illustrates an example, non-limiting top-view scanning electron microscope (SEM) micrograph 700 depicting a device comprising device 400 of FIG. 4, in accordance with one or more embodiments described herein. In SEM micrograph 700, a portion of metal layer 140 overlaying silicon layer 130 has been selectively removed.

Figure 8:
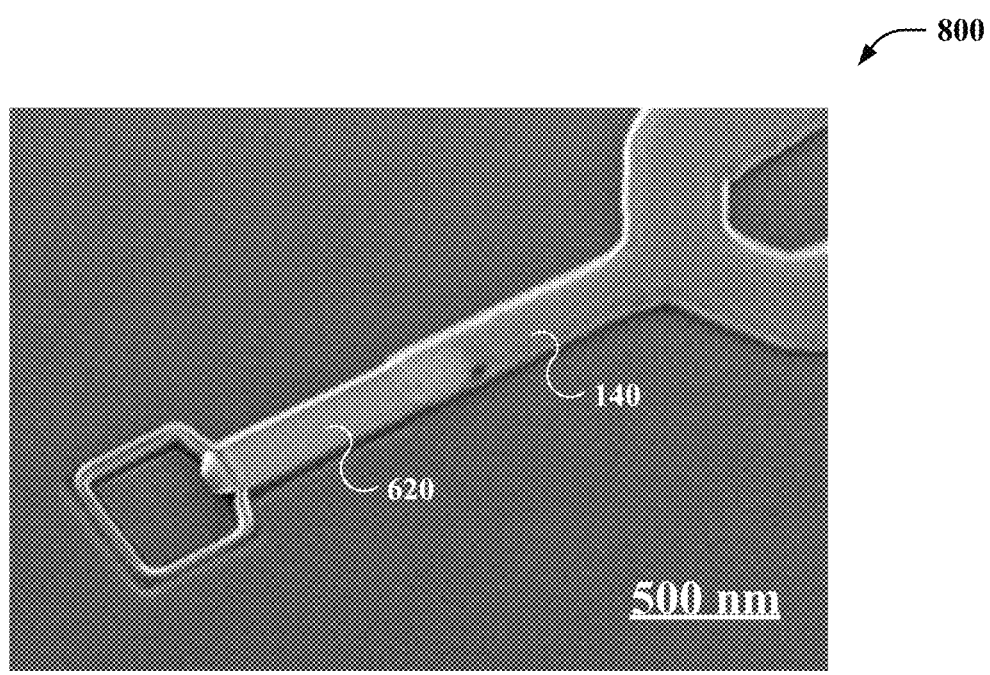
FIG. 8 illustrates an example, non-limiting top-view SEM micrograph depicting the device of FIG. 6, in accordance with one or more embodiments described herein.

FIG. 8 illustrates an example, non-limiting top-view SEM micrograph 800 depicting device 600 of FIG. 6, in accordance with one or more embodiments described herein. In SEM micrograph 800, semiconductor 620 has been grown where a portion of silicon layer 130 was etched for removal under metal layer 140. FIG. 8 shows that a high-transparency interface between metal layer 140 and semiconductor 620 is formed in situ during growth of semiconductor 620.

Figure 9:
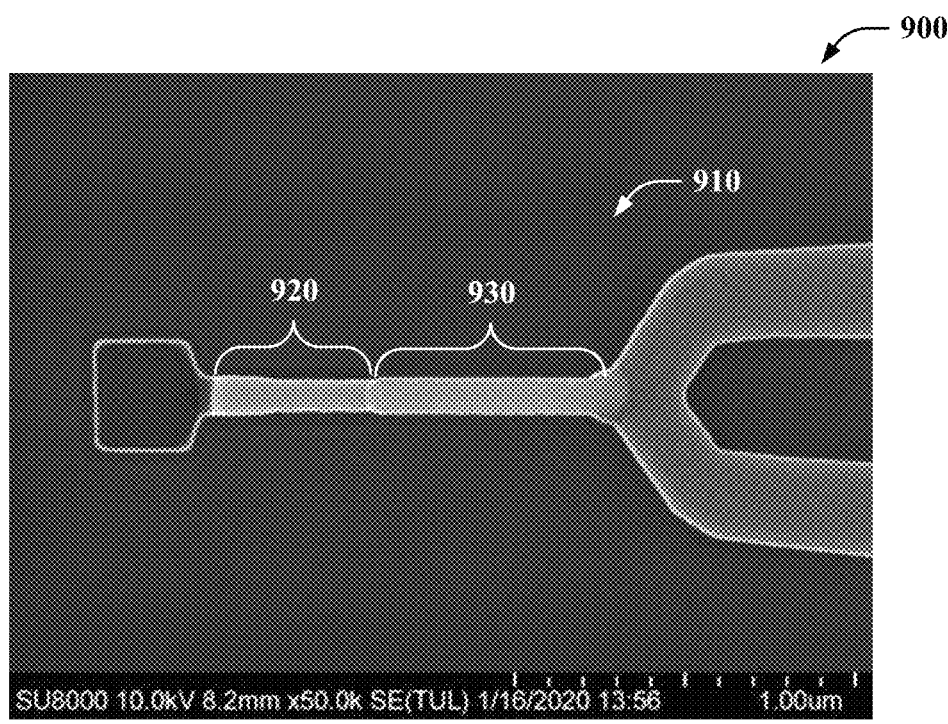
FIG. 9 illustrates an example, non-limiting top-view SEM micrograph depicting indium arsenide (InAs) nanowires grown in a partially superconducting template, in accordance with one or more embodiments described herein.

FIG. 9 illustrates an example, non-limiting top-view SEM micrograph 900 depicting InAs nanowires grown in a partially superconducting template 910, in accordance with one or more embodiments described herein. SEM micrograph 900 shows that the InAs nanowires are not covered by a metal layer (e.g., TiN) in a first portion 920 of template 910. SEM micrograph 900 further shows that the InAs nanowires are fully covered by the metal layer in a second portion 930 of template 910.

Figure 10:
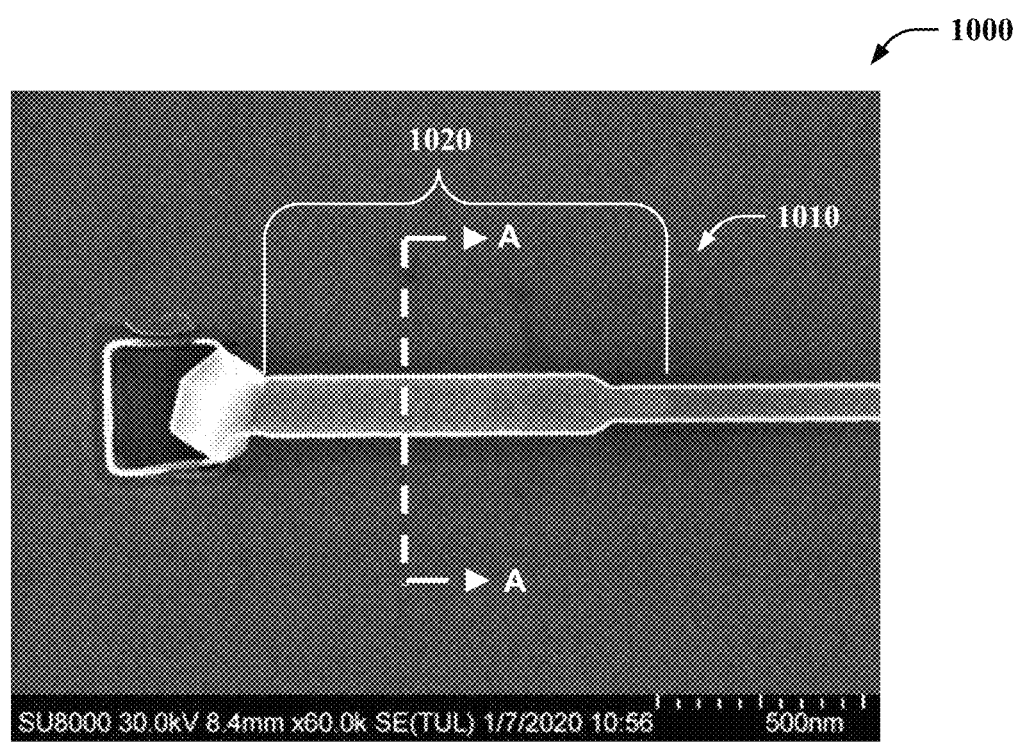
FIG. 10 illustrates an example, non-limiting top-view SEM micrograph depicting InAs nanowires grown in a fully superconducting template, in accordance with one or more embodiments described herein.

FIG. 10 illustrates an example, non-limiting top-view SEM micrograph 1000 depicting InAs nanowires grown in a fully superconducting template 1010, in accordance with one or more embodiments described herein. SEM micrograph 1000 shows that the InAs nanowires are fully covered by a metal layer (e.g., TiN) in a portion 1020 of template 1010.

Figure 11:
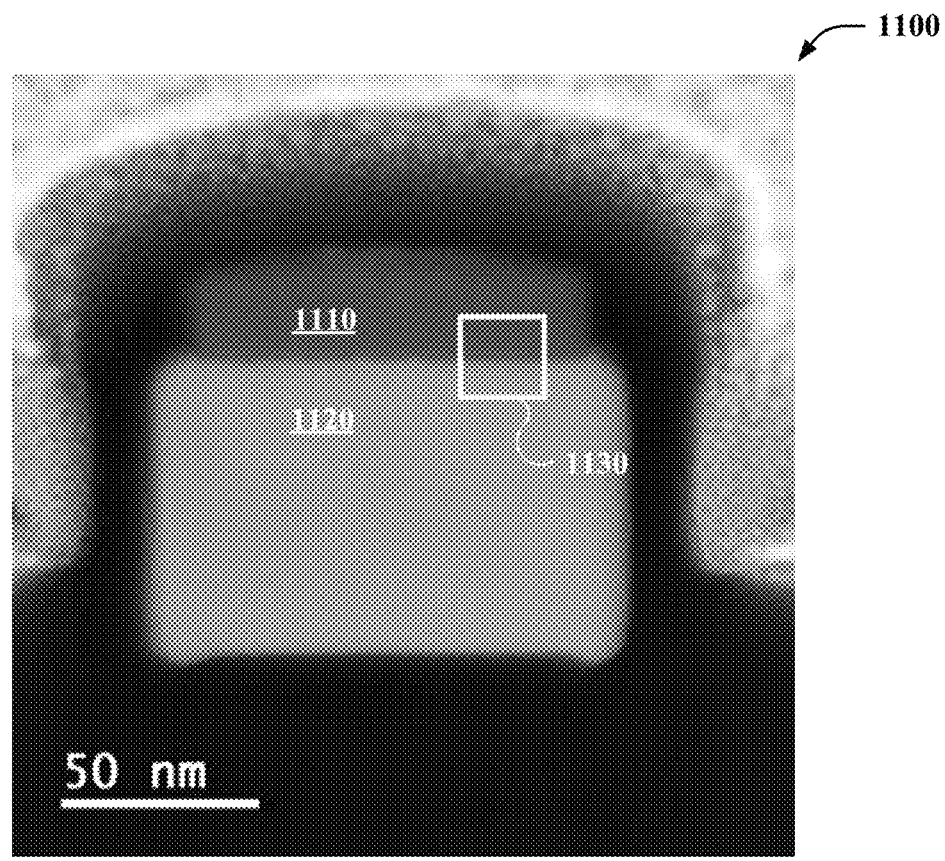
FIG. 11 illustrates an example, non-limiting transmission electron microscope (TEM) cross-sectional view of the fully superconducting template of FIG. 10 taken along line A-A, in accordance with one or more embodiments described herein.
Figure 12:
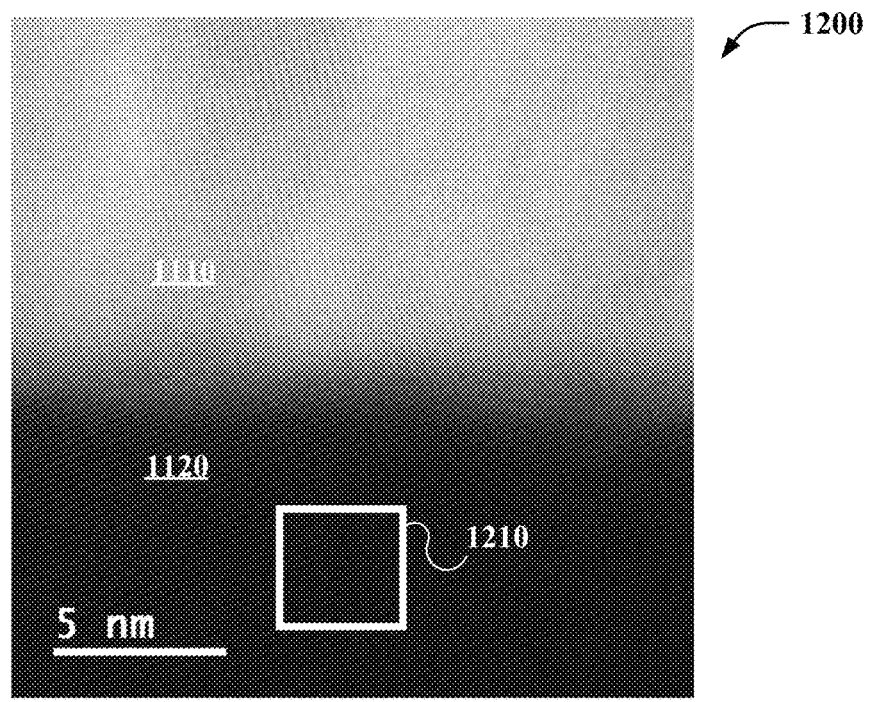
FIG. 12 illustrates an example, non-limiting close-up view depicting a high-transparency, semiconductor-metal interface within the cross-sectional view of FIG. 11, in accordance with one or more embodiments described herein.
Figure 13:
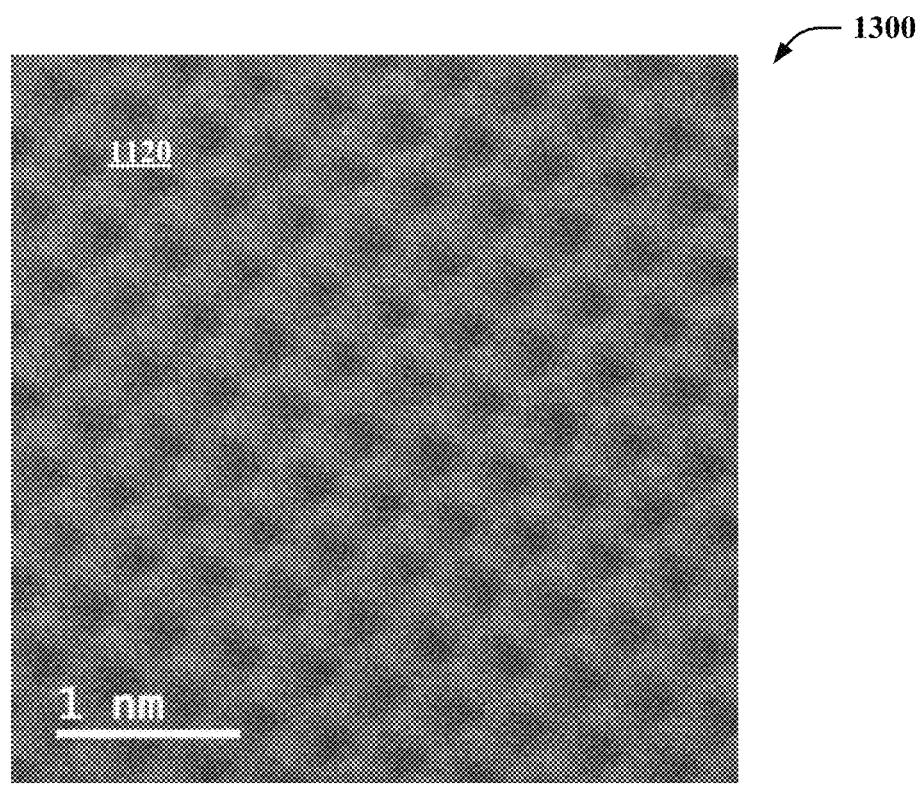
FIG. 13 illustrates an example, non-limiting close-up view depicting a portion of the semiconductor within the cross-sectional view of FIG. 11, in accordance with one or more embodiments described herein.

FIGS. 11-13 illustrate example, non-limiting transmission electron microscope (TEM) cross-sectional views of the fully superconducting template 1010 of FIG. 10 taken along line A-A, in accordance with one or more embodiments described herein. FIG. 11 illustrates a view 1100 depicting a high-transparency interface between a metal layer 1110 (e.g., TiN) and a semiconductor 1120 (e.g., InAs) formed in situ during growth of semiconductor 1120. FIG. 12 illustrates a closeup view 1200 depicting a region 1130 of the high-transparency interface between metal layer 1110 and semiconductor 1120 of FIG. 11. The brightness of layers 1110 and 1120 is reversed in FIG. 12 with respect to their respective brightness in FIG. 11 because different TEM detectors were used to capture FIGS. 11 and 12. FIG. 13 illustrates a closeup view 1300 depicting a region 1210 of semiconductor 1120 from FIG. 12. As shown by FIG. 13, semiconductor 1120 can comprise a monocrystalline structure with no grain boundaries.

Figure 14:
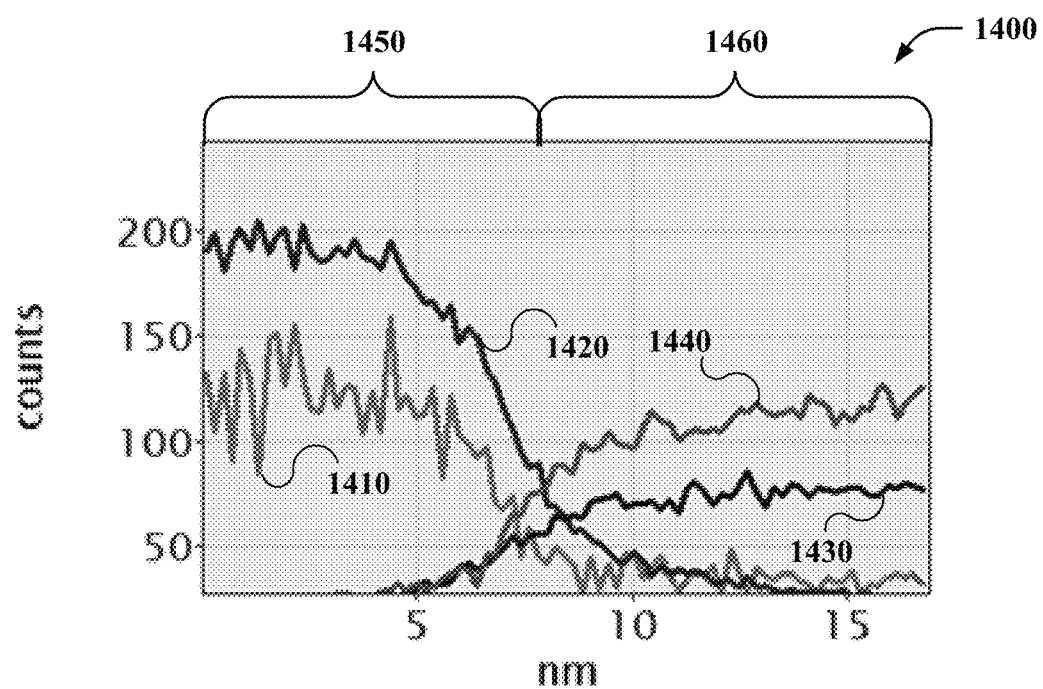
FIG. 14 illustrates an example, non-limiting graph depicting results of an energy-dispersive X-ray spectroscopy (EDX) scan of the high-transparency, semiconductor-metal interface depicted in FIG. 11, in accordance with one or more embodiments described herein.

FIG. 14 illustrates an example, non-limiting graph 1400 depicting results of an energy-dispersive X-ray spectroscopy (EDX) scan of the high-transparency, semiconductor-metal interface depicted in FIG. 11, in accordance with one or more embodiments described herein. Each curve of graph 1400 plots counts of a given element within the interface versus depth. Curve 1410 denotes nitrogen (N), curve 1420 denotes titanium (Ti), curve 1430 denotes arsenic (As), and curve 1440 denotes indium (In). As shown by FIG. 14, TiN predominates the interface in region 1450 of graph 1400 whereas InAs predominates the interface in region 1460 of graph 1400.

Figure 15:
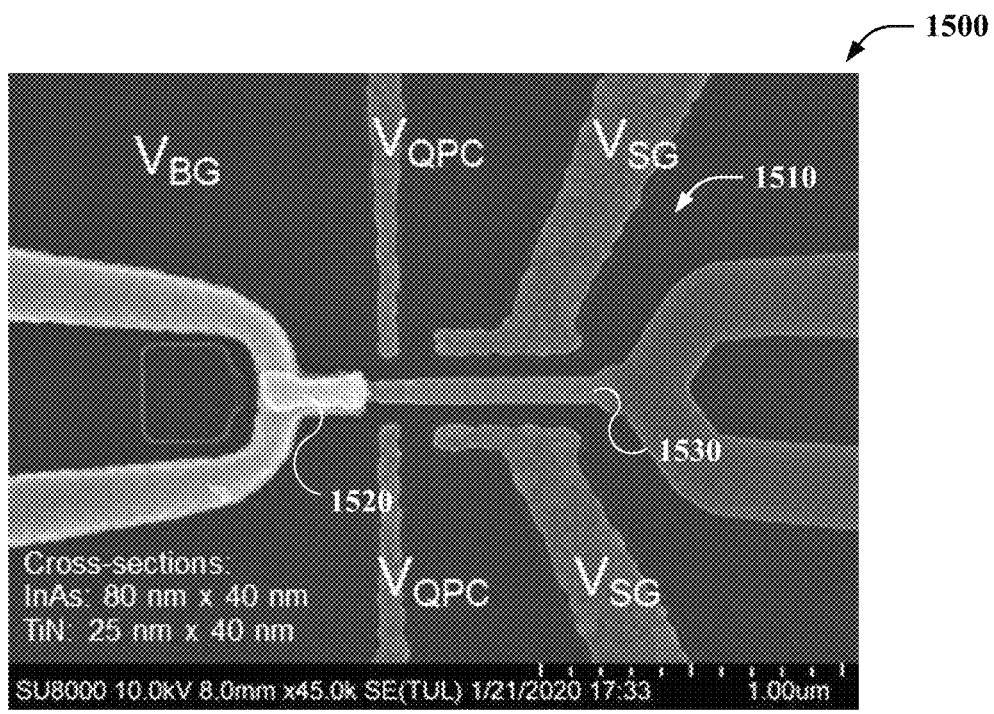
FIG. 15 an example, non-limiting top-view SEM micrograph depicting a device comprising a high-transparency, semiconductor-metal interface, in accordance with one or more embodiments described herein.

FIG. 15 an example, non-limiting top-view SEM micrograph 1500 depicting a device 1510 comprising high-transparency, semiconductor-metal interfaces, in accordance with one or more embodiments described herein. Device 1510 can comprise a high-transparency, semiconductor-non-superconductor interface between a semiconductor and a non-superconductor in contact 1520. Device 1510 can further comprise a high-transparency, semiconductor-superconductor interface between a semiconductor and a superconductor in contact 1530.

Figure 16:
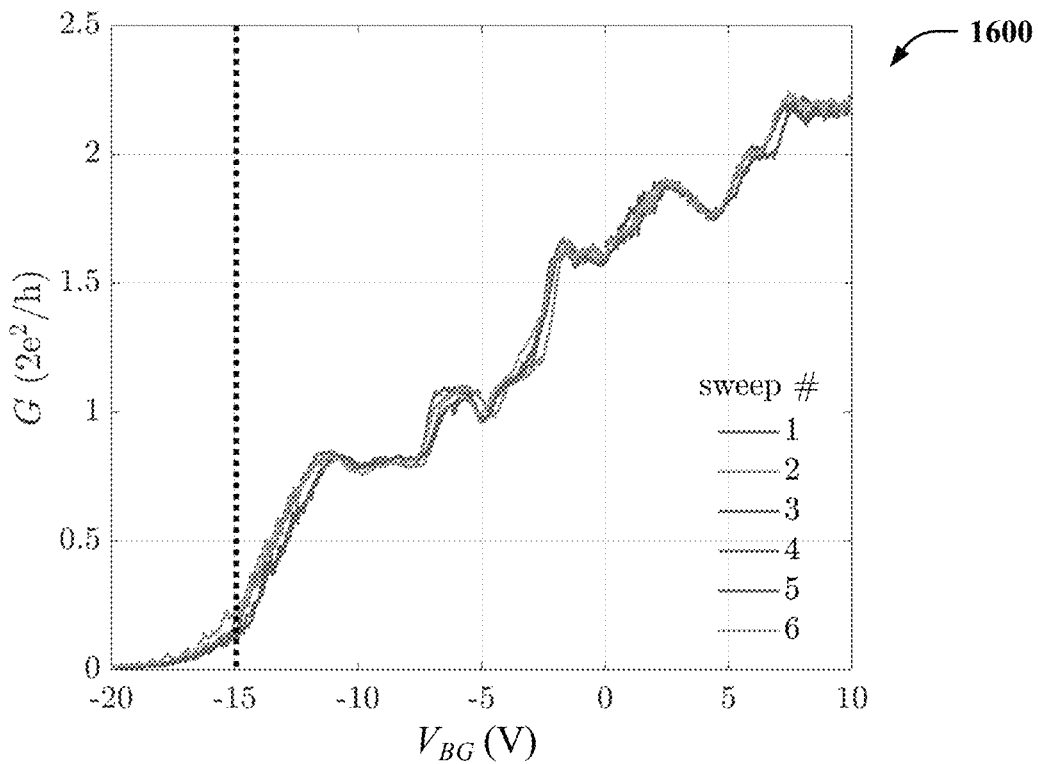
FIG. 16 illustrates an example, non-limiting graph depicting differential conductance as a function of back gate bias voltage, in accordance with one or more embodiments described herein.

FIGS. 16-24 illustrate example, non-limiting charts depicting an electrical characterization of the semiconductor-superconductor interface in contact 1530 of device 1510, in accordance with one or more embodiments described herein. FIG. 16 depicts the results of tuning a back gate of device 1510 at a temperature of 14 Kelvin (K) by varying a $V_{BG}$ while holding a split gate bias voltage ($V_{QPC}$) and a side gate bias voltage ($V_{SG}$) constant at 0 V. In particular, FIG. 16 illustrates an example, non-limiting graph 1600 depicting differential conductance as a function of back gate bias voltage ($V_{BG}$). As denoted by the vertical dotted line of FIG. 16, a back gate bias voltage of device 1510 can be set to −15 V in order to be in a tunneling regime and to cool a temperature of device 1510 to a base temperature.

Figure 17:
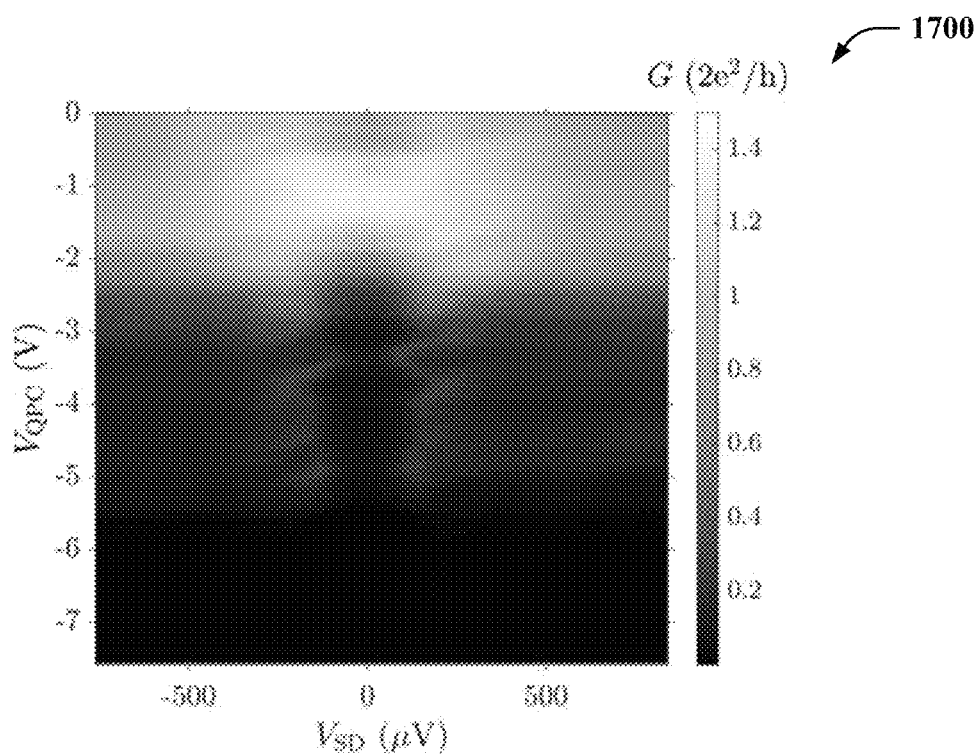
FIG. 17 illustrates an example, non-limiting linearly scaled graph depicting differential conductance versus split gate bias voltage and source-drain bias voltage, in accordance with one or more embodiments described herein.
Figure 18:
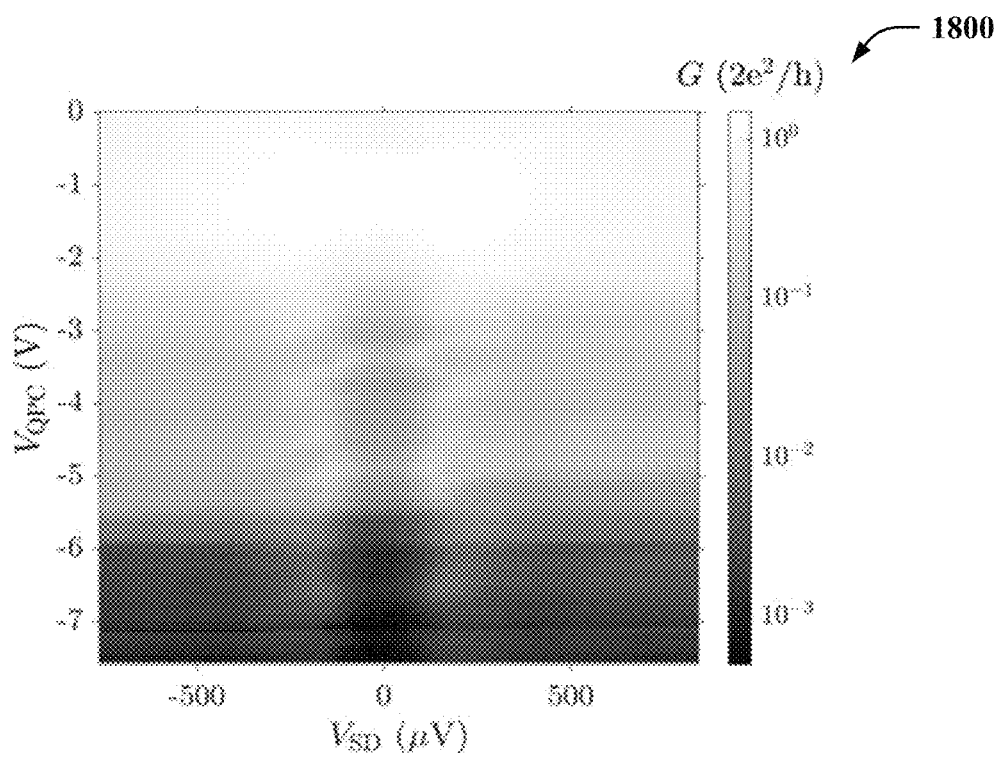
FIG. 18 illustrates an example, non-limiting logarithmically scaled graph depicting differential conductance versus split gate bias voltage and source-drain bias voltage, in accordance with one or more embodiments described herein.
Figure 19:
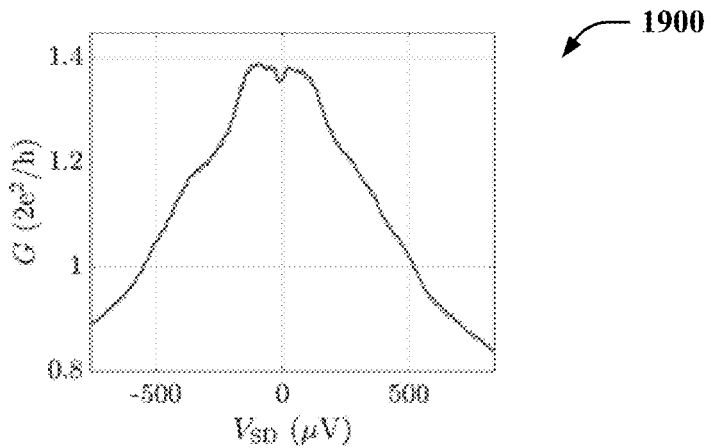
FIG. 19 illustrates an example, non-limiting graph depicting differential conductance as a function of source-drain bias voltage at a split gate bias voltage of approximately −1.1 volts, in accordance with one or more embodiments described herein.

FIGS. 17-22 depict the results of tuning the split gates of device 1510 at a temperature of 20 millikelvin (mK) while holding $V_{SG}$ constant at 0 V. FIG. 17 illustrates an example, non-limiting linearly scaled graph 1700 depicting differential conductance versus $V_{QPC}$ and source-drain bias voltage ($V_{SD}$). FIG. 18 illustrates an example, non-limiting logarithmically scaled graph 1800 depicting differential conductance versus $V_{QPC}$ and $V_{SD}$. FIG. 19 illustrates an example, non-limiting graph 1900 depicting differential conductance as a function of $V_{SD}$ at a $V_{QPC}$ of approximately −1.1 volts, which corresponds to the solid line intersecting the $V_{QPC}$ axis of graph 2200 illustrated by FIG. 22. In particular, graph 1900 illustrates Andreev-enhanced conductance by the semiconductor-superconductor interface in contact 1530 of device 1510.

Figure 20:
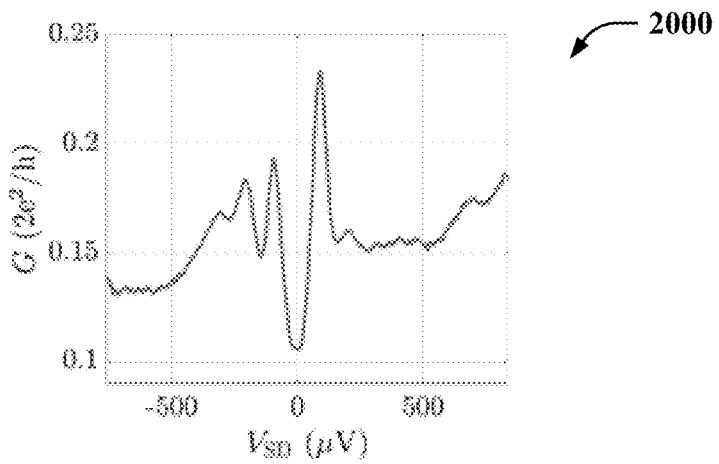
FIG. 20 illustrates an example, non-limiting graph depicting differential conductance as a function of source-drain bias voltage at a split gate bias voltage of approximately −3.375 volts, in accordance with one or more embodiments described herein.
Figure 21:
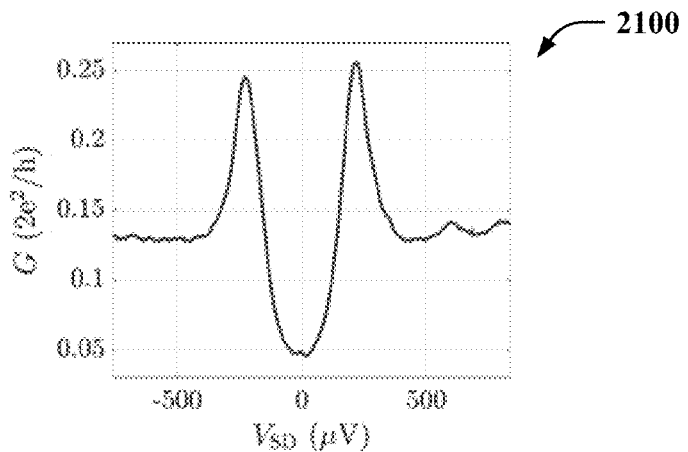
FIG. 21 illustrates an example, non-limiting graph depicting differential conductance as a function of source-drain bias voltage at a split gate bias voltage of approximately −3.75 volts, in accordance with one or more embodiments described herein.
Figure 22:
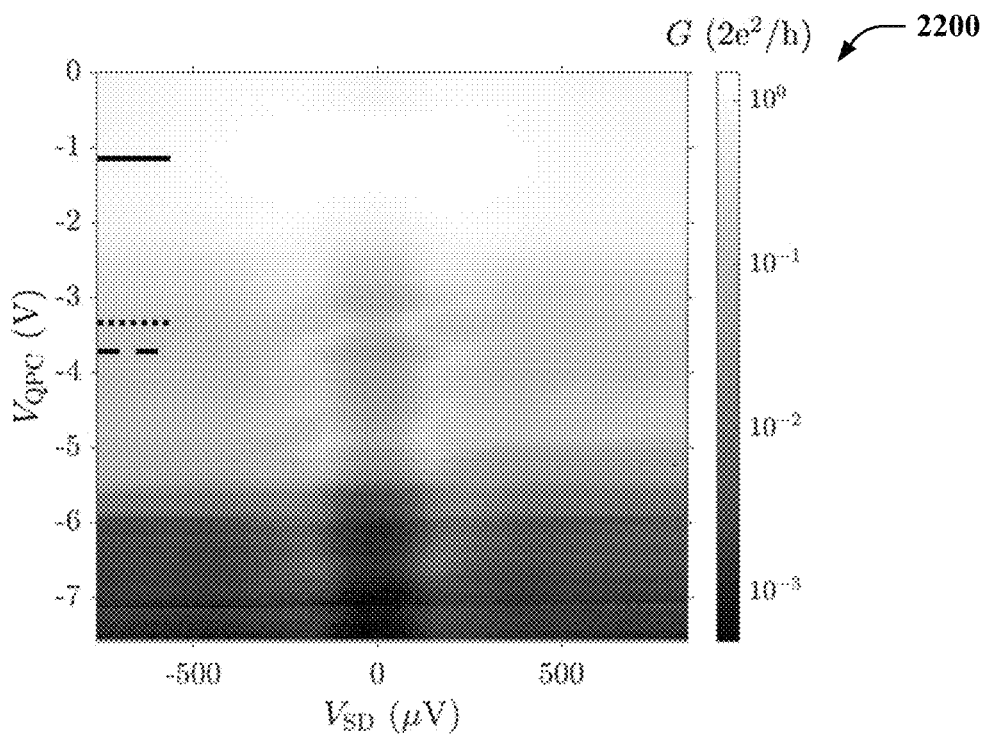
FIG. 22 illustrates the example, non-limiting logarithmically scaled graph of FIG. 18 recording the split gate bias voltages of FIGS. 19-21, in accordance with one or more embodiments described herein.

FIG. 20 illustrates an example, non-limiting graph 2000 depicting differential conductance as a function of $V_{SD}$ at a $V_{QPC}$ of approximately −3.375 volts, which corresponds to the dotted line intersecting the $V_{QPC}$ axis of graph 2200 illustrated by FIG. 22. In particular, graph 2000 illustrates the emergence of sub-gap states at the semiconductor-superconductor interface in contact 1530 of device 1510. FIG. 21 illustrates an example, non-limiting graph 2100 depicting differential conductance as a function of $V_{SD}$ at a $V_{QPC}$ of approximately −3.75 volts, which corresponds to the dashed line intersecting the $V_{QPC}$ axis of graph 2200 illustrated by FIG. 22. In particular, graph 2100 illustrates spectroscopy of the superconducting gap at the semiconductor-superconductor interface in contact 1530 of device 1510. FIG. 22 illustrates an example, non-limiting logarithmically scaled graph 2200 depicting differential conductance versus $V_{QPC}$ and $V_{SD}$, in accordance with one or more embodiments described herein.

Figure 23:
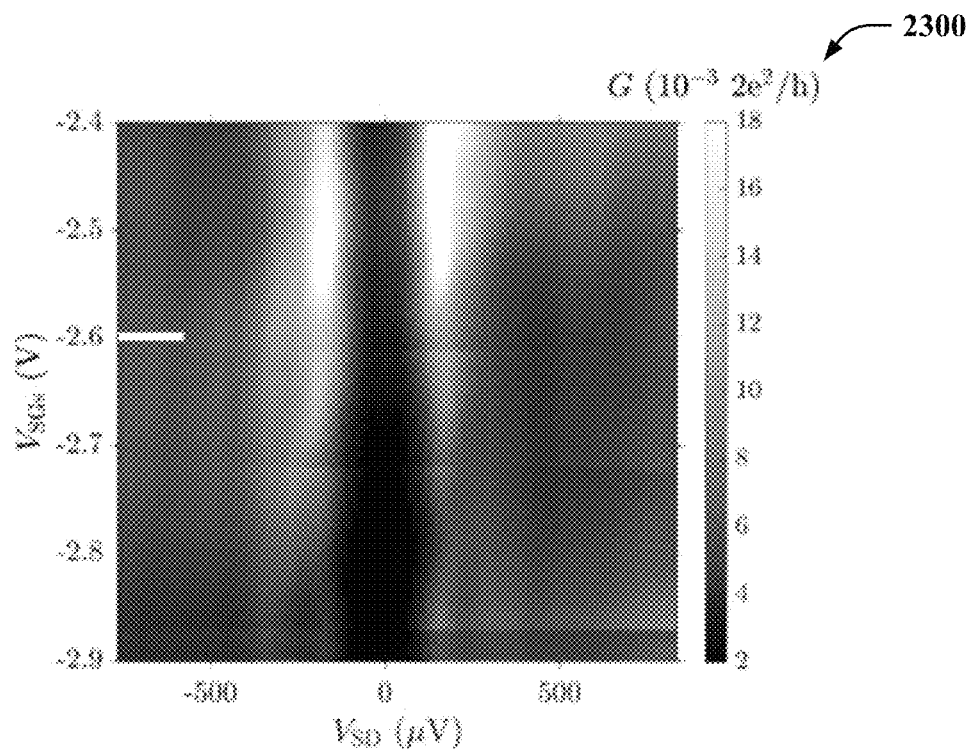
FIG. 23 illustrates an example, non-limiting linearly scaled graph depicting differential conductance versus side gate bias voltage and source-drain bias voltage, in accordance with one or more embodiments described herein.
Figure 24:
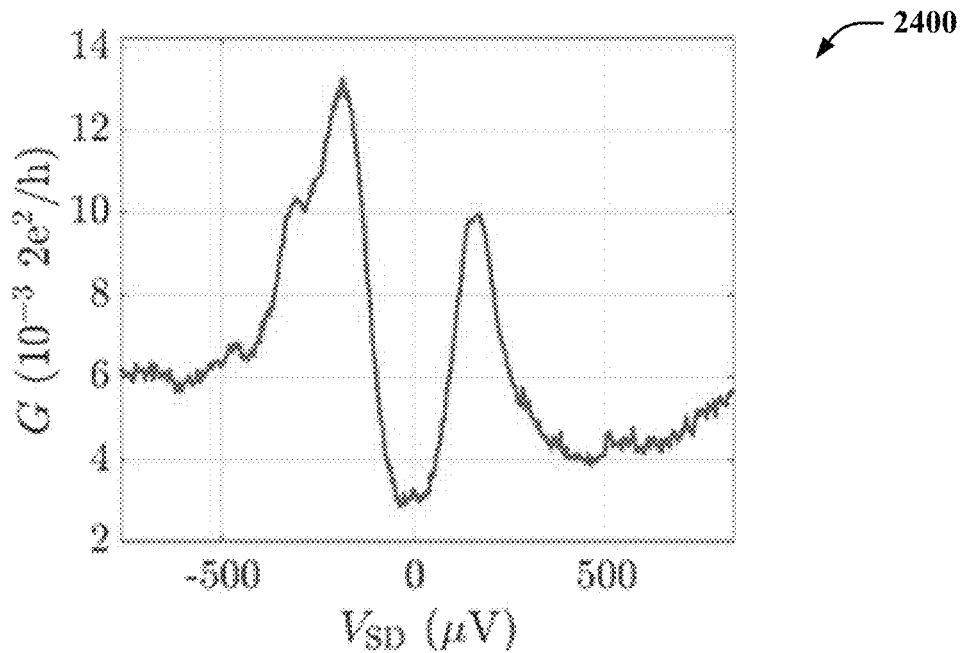
FIG. 24 illustrates an example, non-limiting graph depicting differential conductance as a function of source-drain bias voltage at a side gate bias voltage of approximately −2.6 volts, in accordance with one or more embodiments described herein.

FIGS. 23-24 depict the results of tuning the side gates of device 1510. FIG. 23 illustrates an example, non-limiting linearly scaled graph 2300 depicting differential conductance versus $V_{SG}$ and $V_{SD}$, in accordance with one or more embodiments described herein. FIG. 24 illustrates an example, non-limiting graph 2400 depicting differential conductance as a function of $V_{SD}$ at a $V_{SG}$ of approximately −2.6 volts, which corresponds to the solid line intersecting the $V_{SG}$ axis of graph 2300 illustrated by FIG. 23.

FIGS. 25-44 illustrate cross-sectional views of example, non-limiting devices with high-transparency semiconductor-metal interfaces, in accordance with one or more embodiments described herein. FIGS. 25-44 show that embodiments of the present disclosure can implement devices with high-transparency semiconductor-metal interfaces in a variety of configurations. Each device illustrated in FIGS. 25-44 comprises a semiconductor grown where a portion (e.g., portion 520 of FIG. 5) of a silicon layer was removed. Device 2500 of FIG. 25 can comprise an example, non-limiting alternative embodiment of device 600 of FIG. 6 featuring a continuous stripe of metal layer 140. In an embodiment, device 2500 can be formed by omitting the removal of the portion of metal layer 140 from structure 210 depicted in FIG. 3. In this embodiment, structure 2510 can be formed by growing semiconductor 620 from where a portion of silicon layer 130 was removed.

Figure 26:
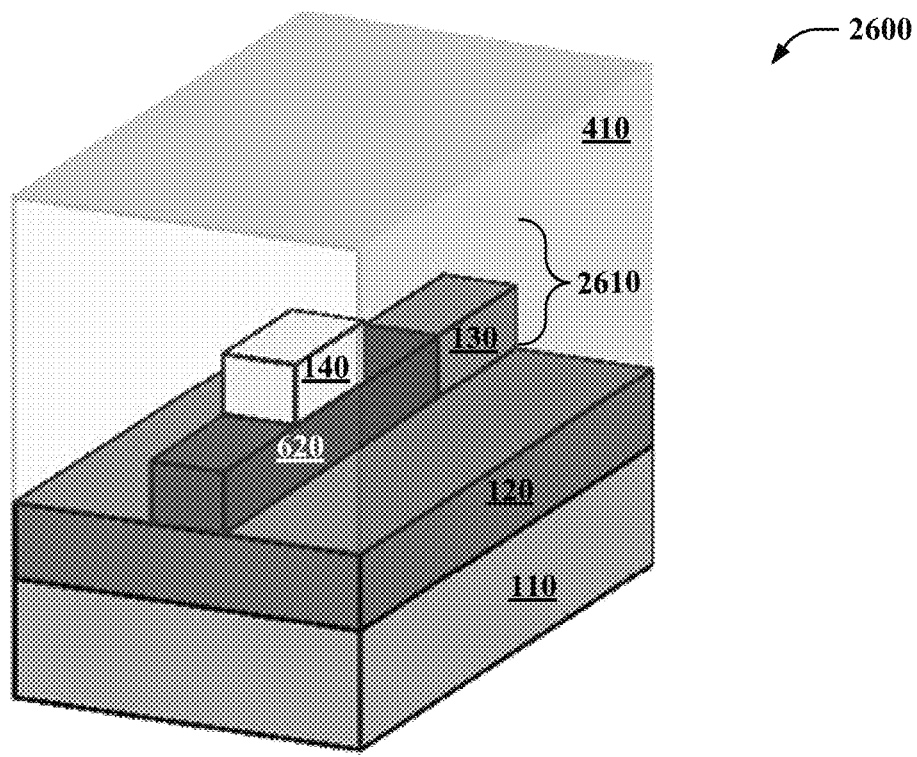

Device 2600 of FIG. 26 can comprise an example, non-limiting alternative embodiment of device 600 of FIG. 6 after removing a portion of metal layer 140 from structure 610 to form a structure 2610. In an embodiment, the portion of metal layer 140 can be removed from structure 210 using selective etching. In an embodiment, the portion of metal layer 140 can be removed from structure 610 by etching the portion of metal layer 140 in a $H_2O/H_2O_2/NH_4OH$ 5:2:1 solution at 65° C. In an embodiment, removing the portion of metal layer 140 from structure 610 can comprise EBL patterning using CSAR as a positive resist.

Figure 25:
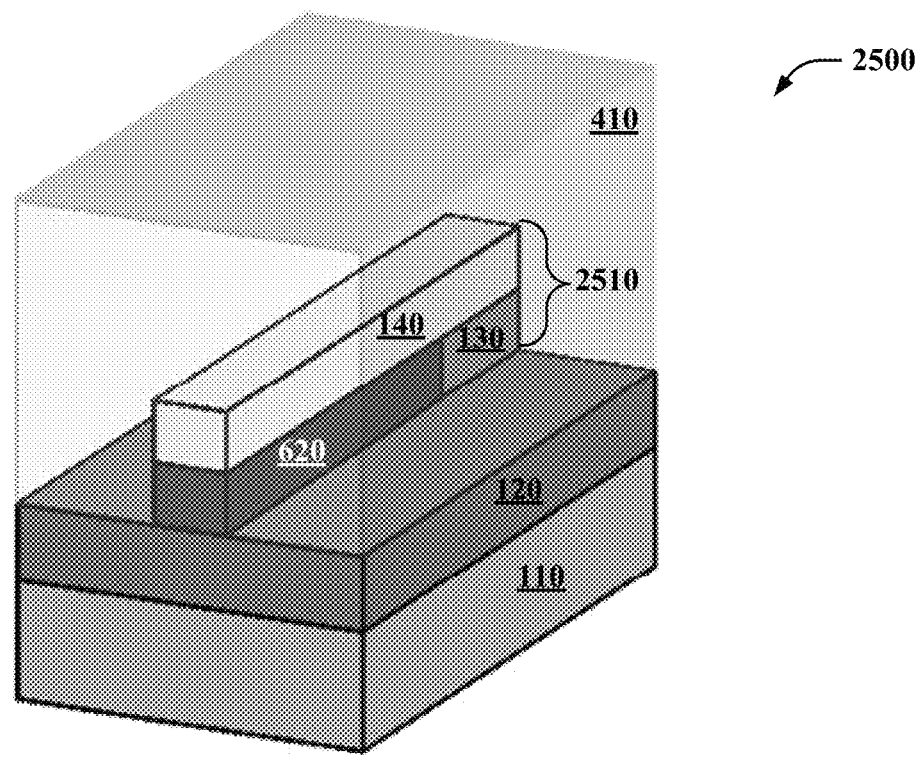
FIGS. 25-27 illustrate cross-sectional views of example, non-limiting devices with high-transparency semiconductor-metal interfaces, in accordance with one or more embodiments described herein.
Figure 27:
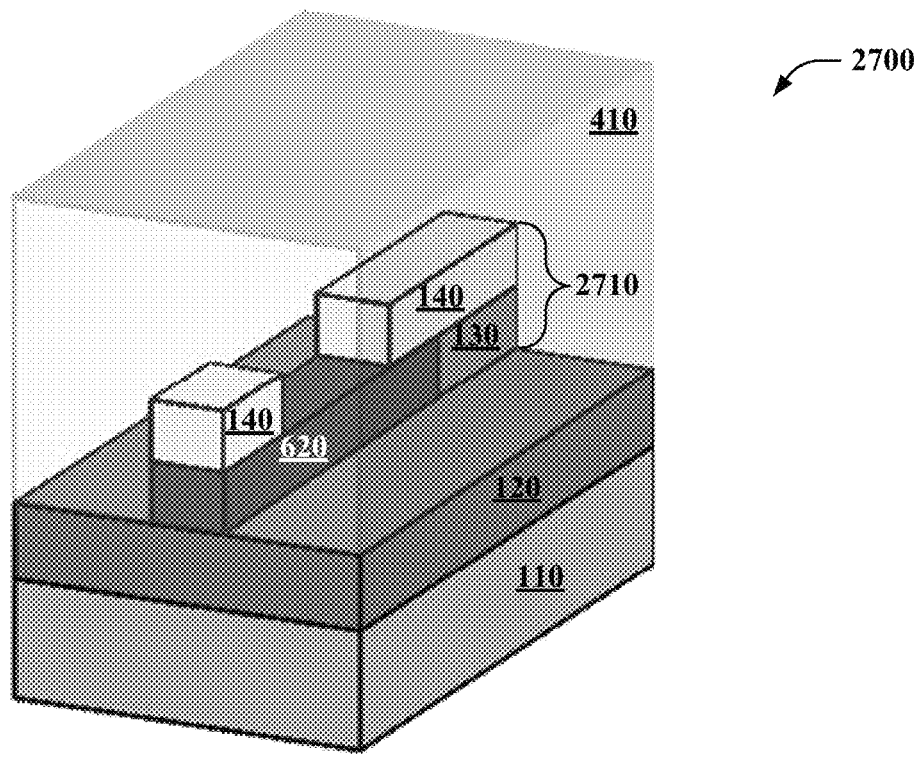

Device 2700 of FIG. 27 can comprise an example, non-limiting alternative embodiment of device 2500 of FIG. 25 featuring interrupted segments of metal layer 140. Device 2700 can be formed by removing a portion of metal layer 140 from structure 2510 to form a structure 2710. In an embodiment, the portion of metal layer 140 can be removed from structure 2510 by etching the portion of metal layer 140 in a $H_2O/H_2O_2/NH_4OH$ 5:2:1 solution at 65° C. In an embodiment, removing the portion of metal layer 140 from structure 2510 can comprise EBL patterning using CSAR as a positive resist.

FIGS. 28-38 illustrate cross-sectional views of example, non-limiting devices with high-transparency semiconductor-metal interfaces implemented using multiple metals with different properties, in accordance with one or more embodiments described herein. Each metal layer illustrated in FIGS. 28-38 interfaces with a semiconductor grown where a portion (e.g., portion 520 of FIG. 5) of a silicon layer was removed. Each interface in FIGS. 28-38 is formed in situ during growth of the semiconductor.

Figure 28:
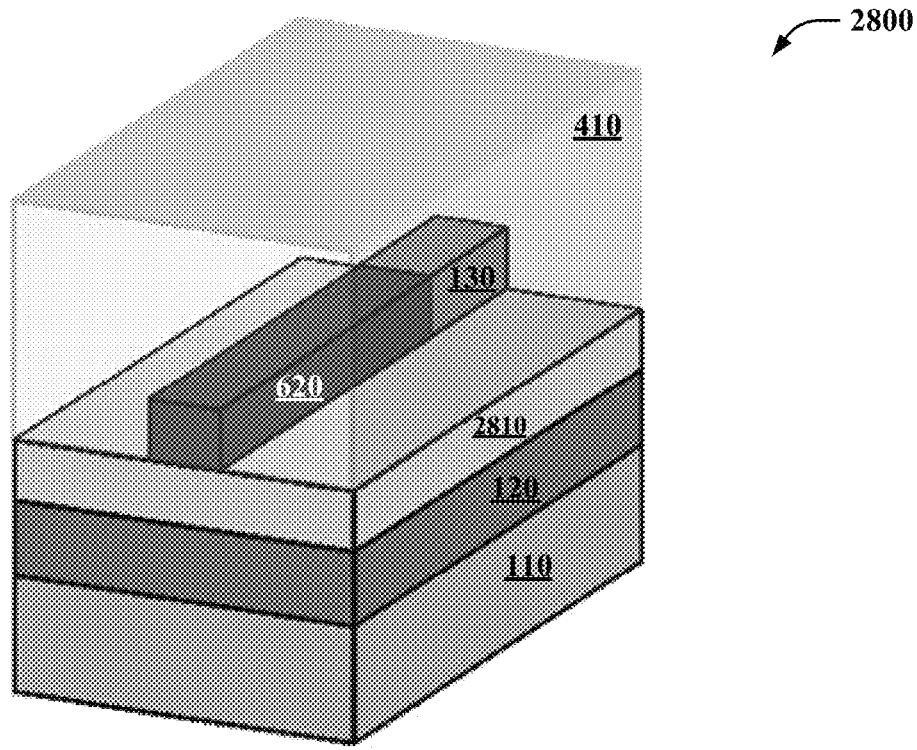
FIGS. 28-38 illustrate cross-sectional views of example, non-limiting devices with high-transparency semiconductor-metal interfaces implemented using multiple metals with different properties, in accordance with one or more embodiments described herein.
Figure 29:
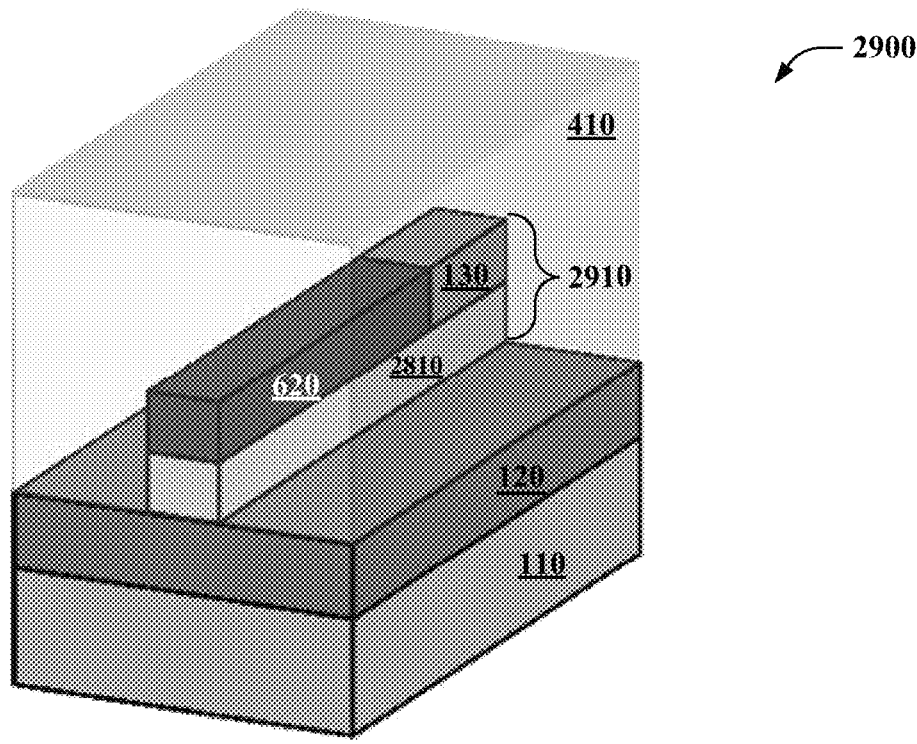
Figure 30:
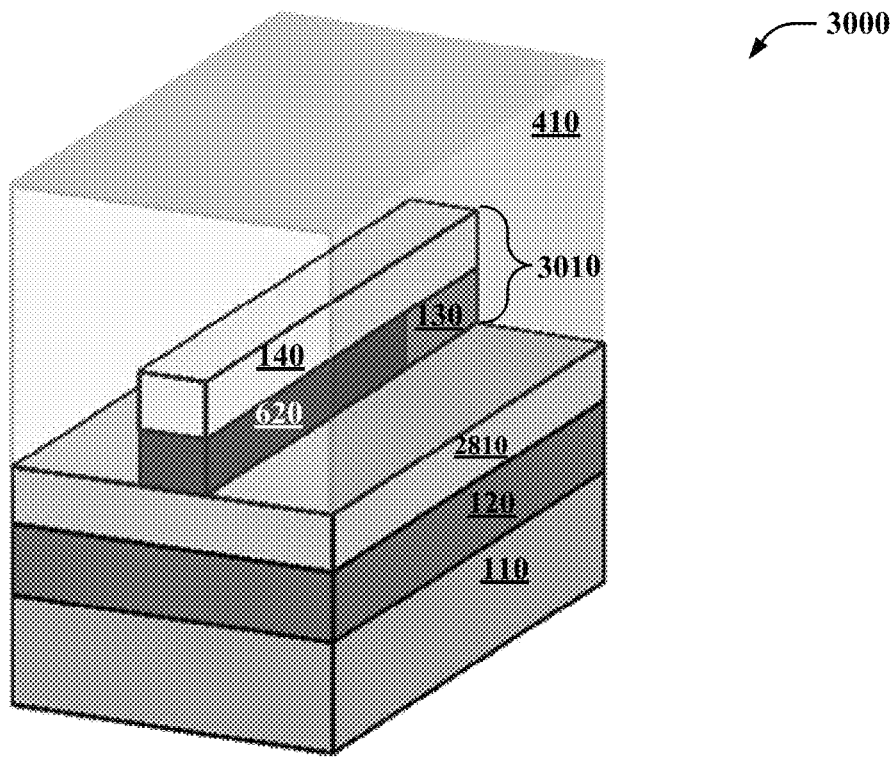
Figure 31:
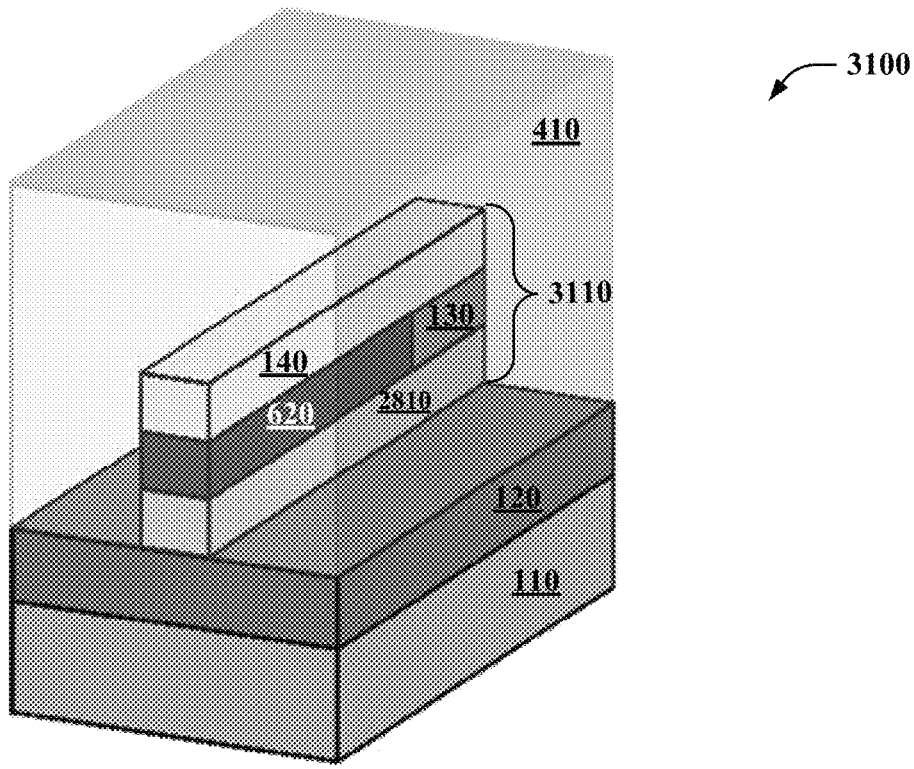

FIG. 28 illustrates an example, non-limiting device 2800 comprising a metal layer 2810 with different properties than metal layer 140 discussed above with respect to FIGS. 1-6. For example, if metal layer 140 comprises TiN, metal layer 2810 can comprise a non-superconductor. As another example, if metal layer 140 comprises a ferromagnetic metal, metal layer 2810 can comprise a superconductor. As another example, if metal layer 140 comprises a non-superconductor, metal layer 2810 can comprise a ferromagnetic metal. In an embodiment, metal layer 2810 can comprise: TiN, a non-superconductor, a superconductor, a ferromagnetic metal, or a combination thereof. Device 2900 of FIG. 29 can comprise an example, non-limiting alternative embodiment of device 2800 of FIG. 28 formed by removing one or more portions of metal layer 2810 from device 2800 to form a structure 2910. FIG. 30 illustrates an example, non-limiting device 3000 formed by growing semiconductor 620 between metal layer 2810 and metal layer 140 that overlays metal layer 2810. Device 3100 of FIG. 31 can comprise an example, non-limiting alternative embodiment of device 3000 of FIG. 30 removing one or more portions of metal layer 2810 from device 3000 to form a structure 3110.

Figure 32:
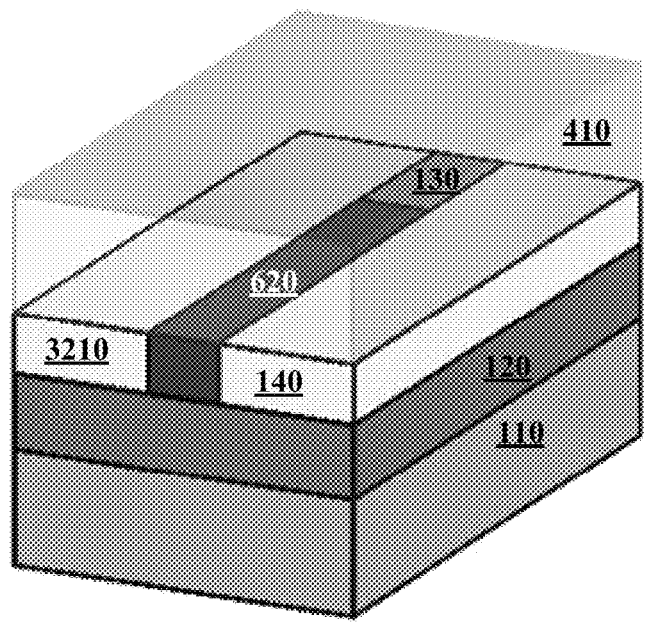

FIG. 32 illustrates an example, non-limiting device 3200 comprising a metal layer 3210 with different properties than metal layer 140 discussed above with respect to FIGS. 1-6. For example, if metal layer 140 comprises a first ferromagnetic metal (e.g., nickel (Ni)), metal layer 3210 can comprise a second ferromagnetic metal (e.g., cobalt (Co)). As another example, if metal layer 140 comprises a first non-superconductor (e.g., phosphor bronze), metal layer 3210 can comprise a second non-superconductor (e.g., cupronickel). As another example, if metal layer 140 comprises a first superconductor (e.g., TiN), metal layer 3210 can comprise a second superconductor (e.g., niobium titanium (NbTi)).

Figure 33:
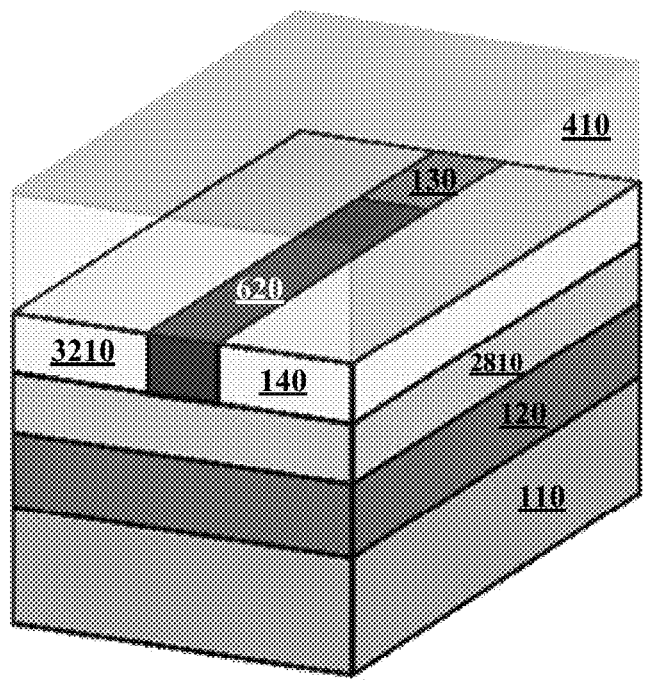
Figure 34:
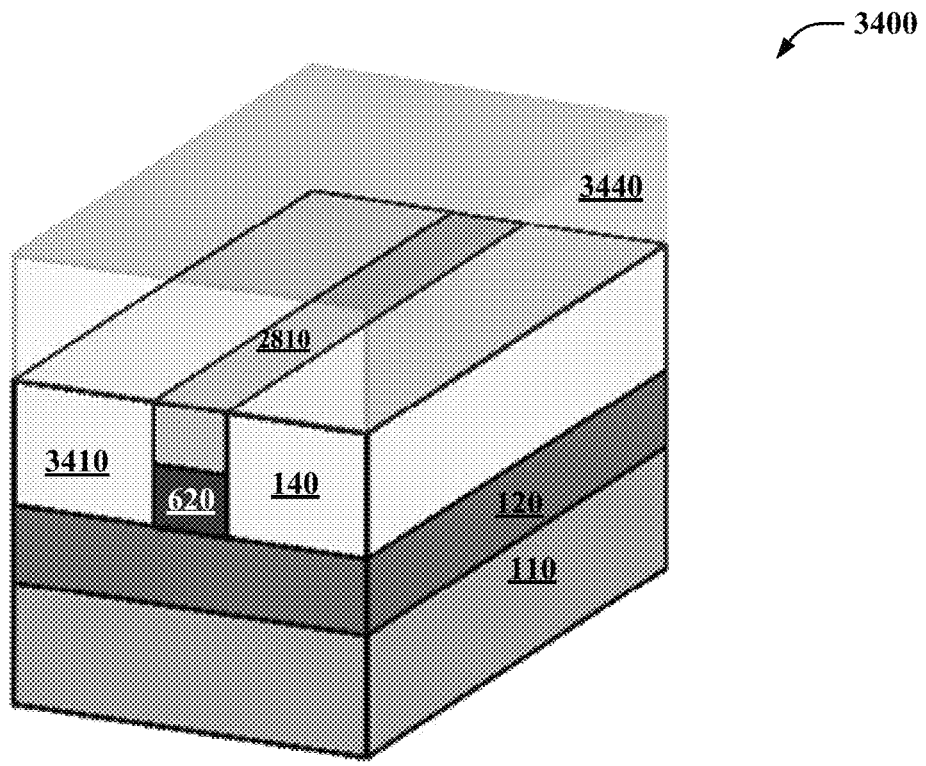
Figure 35:
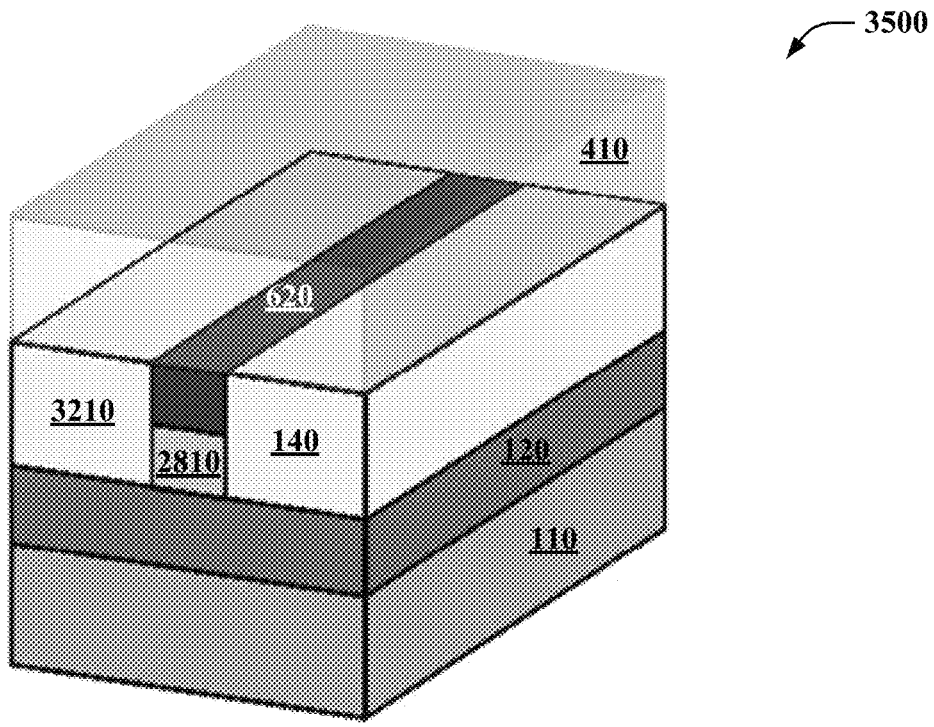
Figure 36:
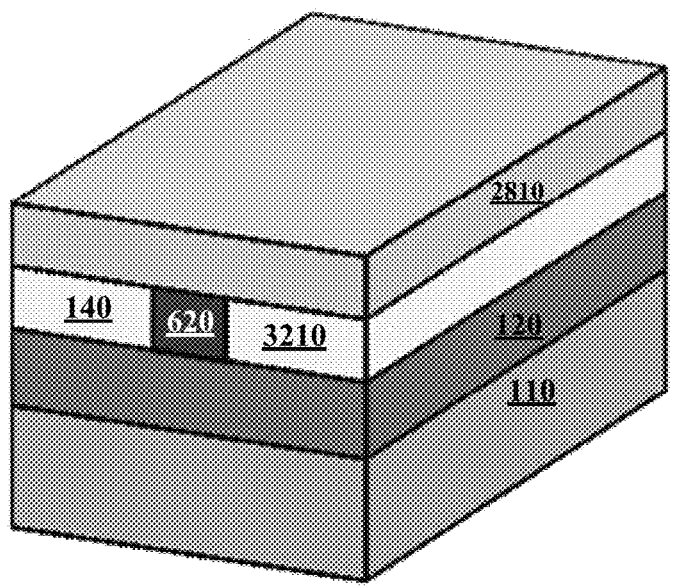

FIG. 33 illustrates an example, non-limiting device 3300 formed by growing semiconductor 620 between metal layer 3210, metal layer 140, and metal layer 2810 that underlays both metal layer 3210 and metal layer 140. FIG. 34 illustrates an example, non-limiting device 3400 formed by growing semiconductor 620 between metal layer 3210, metal layer 140, and metal layer 2810. Device 3400 can comprise a cavity structure defined by metal layer 3210, metal layer 140, metal layer 2810, and a silicon layer (not shown) underlaying metal layer 2810. In an embodiment, metal layer 3210, metal layer 2810, metal layer 140, and the silicon layer each provide a sidewall of the cavity structure. FIG. 35 illustrates an example, non-limiting device 3500 formed by growing semiconductor 620 between metal layer 3210, metal layer 140, and metal layer 2810. In device 3500, semiconductor 620 is grown over metal layer 2810. FIG. 36 illustrates an example, non-limiting device 3600 formed by growing semiconductor 620 between metal layer 3210, metal layer 140, and metal layer 2810. Device 3600 can comprise a cavity structure defined by metal layer 3210, metal layer 140, metal layer 2810, and a silicon layer (not shown) underlaying metal layer 2810. In an embodiment, metal layer 3210, metal layer 2810, metal layer 140, and the silicon layer each provide a sidewall of the cavity structure.

Figure 37:
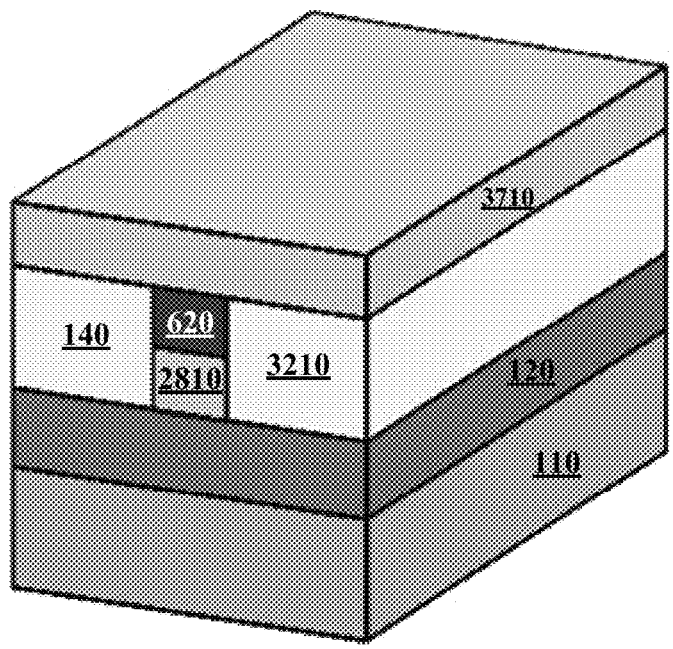

FIG. 37 illustrates an example, non-limiting device 3700 comprising a metal layer 3710 with different properties than both metal layer 2810 discussed above with respect to FIGS. 28-36 and metal layer 140 discussed above with respect to FIGS. 1-6. For example, if metal layer 140 comprises a superconductor and metal layer 2810 comprises a first ferromagnetic metal (e.g., nickel (Ni)), metal layer 3710 can comprise a second ferromagnetic metal (e.g., cobalt (Co)). As another example, if metal layer 140 comprises a ferromagnetic metal and metal layer 2810 comprises a first non-superconductor (e.g., phosphor bronze), metal layer 3710 can comprise a second non-superconductor (e.g., cupronickel). As another example, if metal layer 140 comprises a non-superconductor and metal layer 2810 comprises a first superconductor (e.g., TiN), metal layer 3710 can comprise a second superconductor (e.g., niobium titanium (NbTi)). Device 3700 can comprise a cavity structure defined by metal layer 3210, metal layer 140, metal layer 2810, metal layer 3710, and a silicon layer (not shown) underlaying metal layer 3710. In an embodiment, metal layer 3710, metal layer 3210, metal layer 2810, metal layer 140, and the silicon layer each provide a sidewall of the cavity structure.

Figure 38:
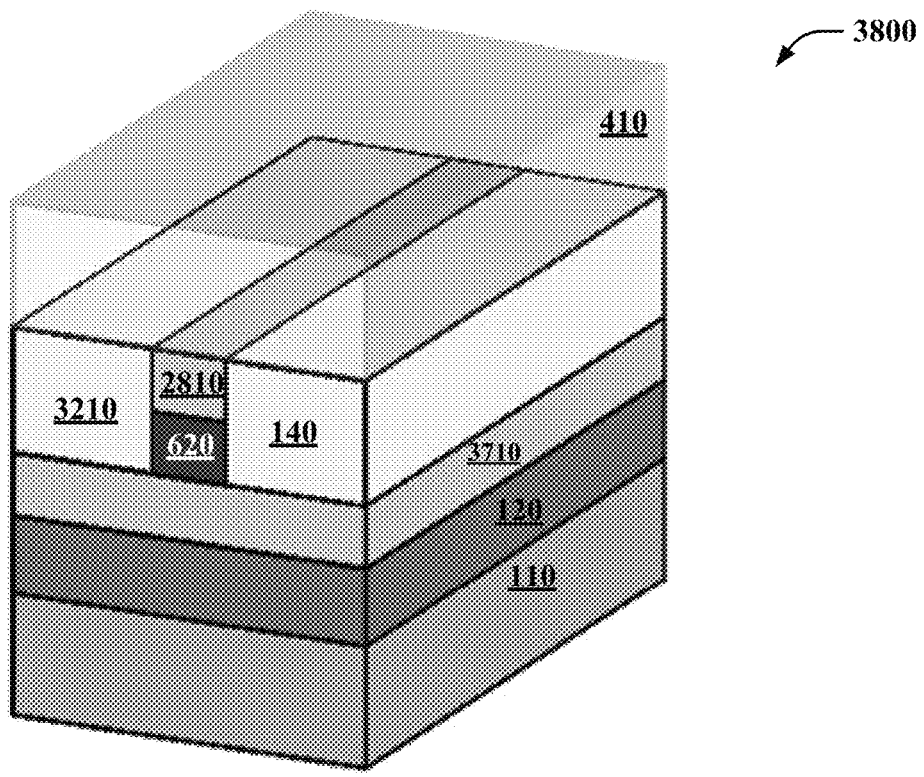

FIG. 38 illustrates an example, non-limiting device 3800 formed by growing semiconductor 620 between metal layer 3710, metal layer 3210, metal layer 140, and metal layer 2810. Device 3800 can comprise a cavity structure defined by metal layer 3710, metal layer 3210, metal layer 140, metal layer 2810, and a silicon layer (not shown) underlaying metal layer 2810. In an embodiment, metal layer 3710, metal layer 3210, metal layer 2810, metal layer 140, and the silicon layer each provide a sidewall of the cavity structure.

Figure 39:
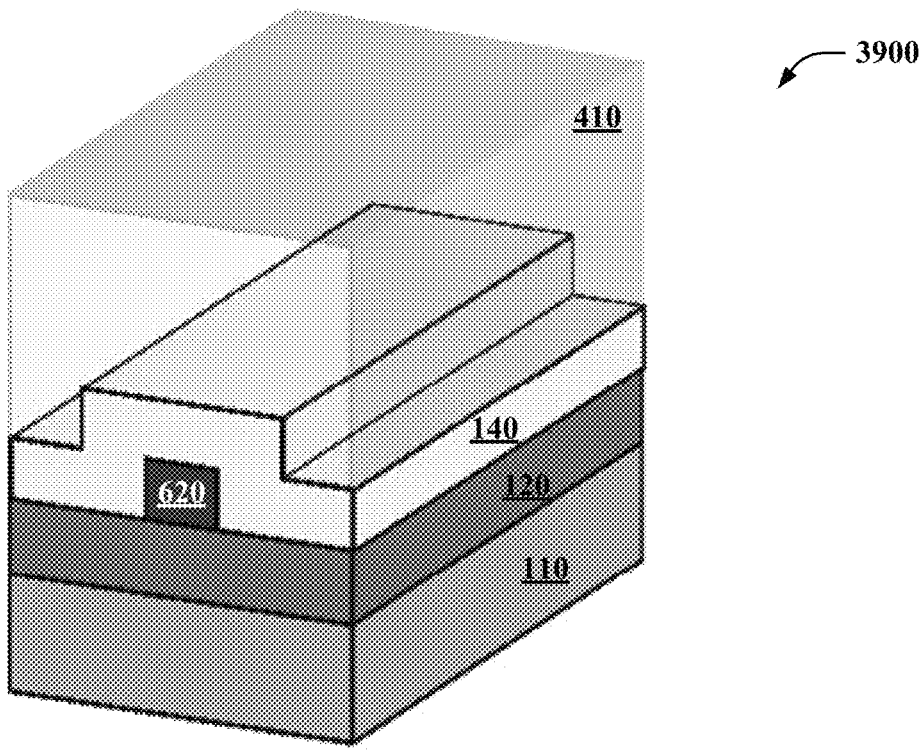
FIGS. 39-43 illustrate cross-sectional views of example, non-limiting devices with high-transparency semiconductor-metal interfaces implemented with a metal overlaying a semiconductor, in accordance with one or more embodiments described herein.
Figure 40:
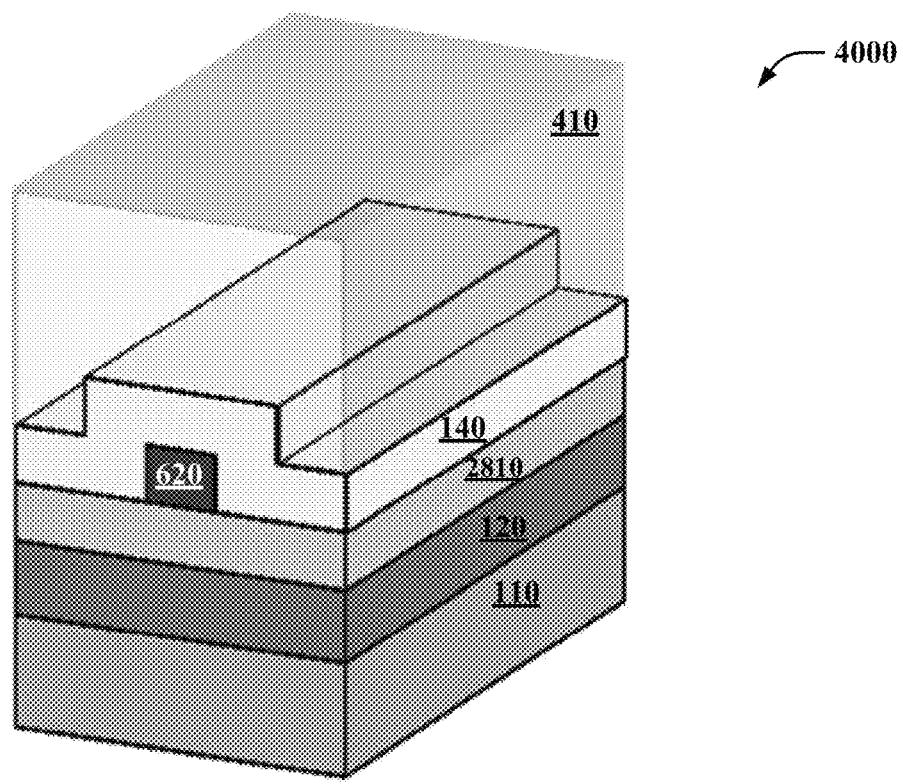

FIGS. 39-43 illustrate cross-sectional views of example, non-limiting devices with high-transparency semiconductor-metal interfaces implemented with a metal overlaying a semiconductor, in accordance with one or more embodiments described herein. FIG. 39 illustrates an example, non-limiting device 3900 formed by growing semiconductor 620 underneath metal layer 140. Device 3900 can comprise a cavity structure defined by metal layer 140 and a silicon layer (not shown) underlaying metal layer 140. In an embodiment, metal layer 140 and the silicon layer each provide a sidewall of the cavity structure. FIG. 40 illustrates an example, non-limiting device 4000 formed by growing semiconductor 620 between metal layer 140 and metal layer 2810. Device 4000 can comprise a cavity structure defined by metal layer 140, metal layer 2810, and a silicon layer (not shown) underlaying metal layer 140. In an embodiment, metal layer 140, metal layer 2810, and the silicon layer each provide a sidewall of the cavity structure.

Figure 41:
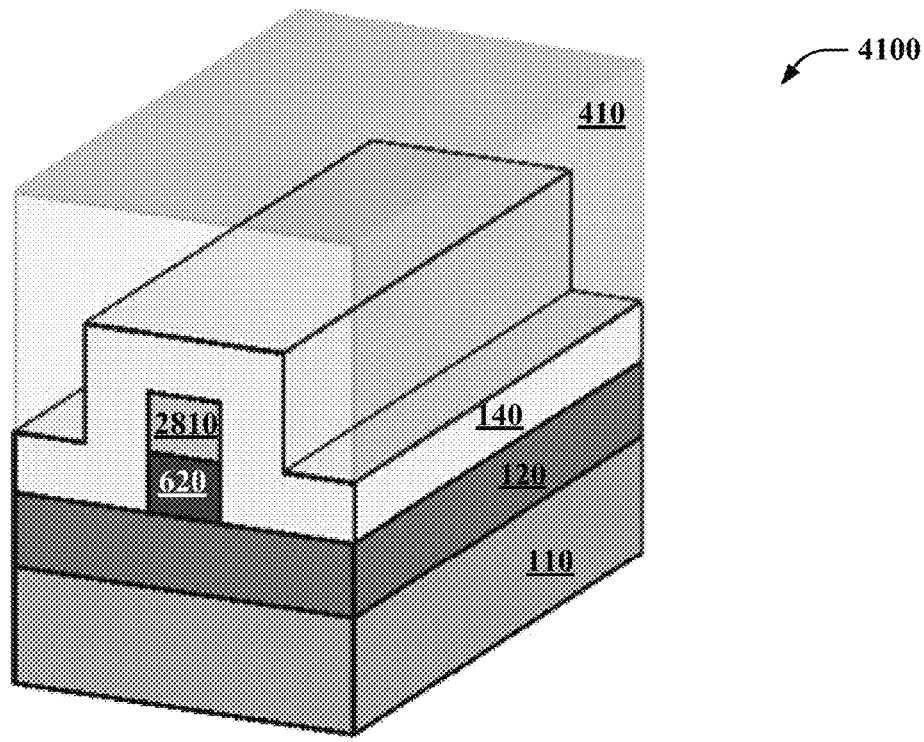
Figure 42:
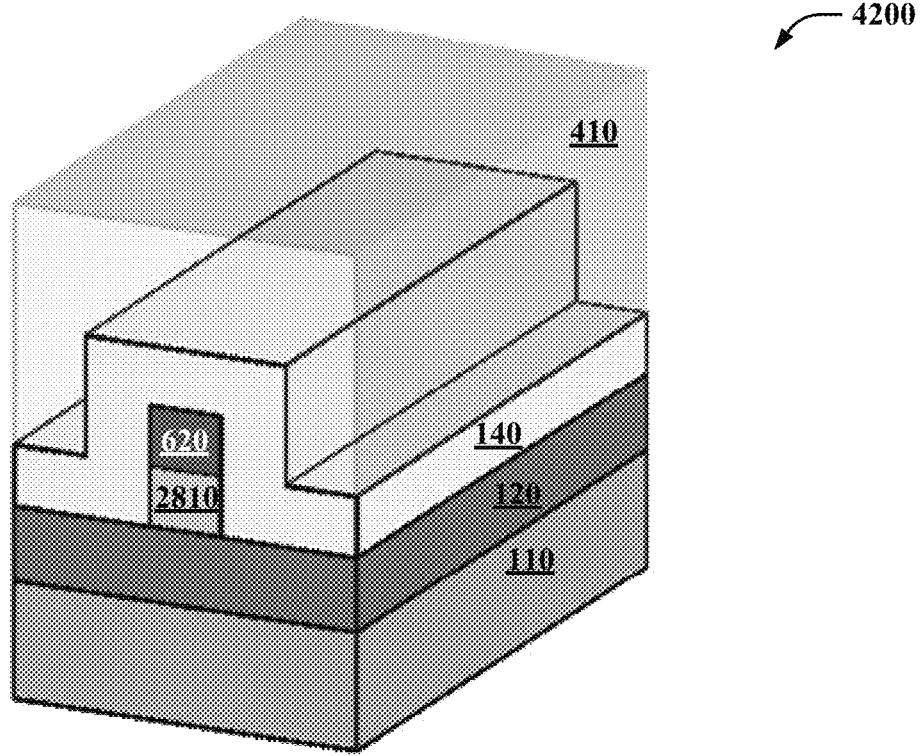
Figure 43:
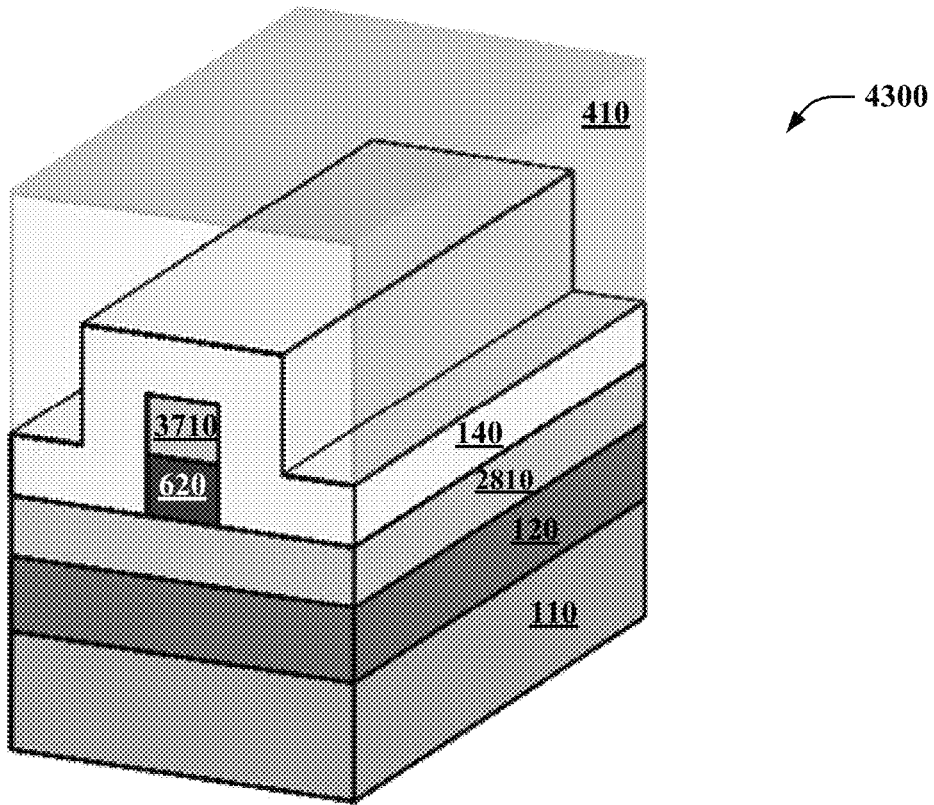

FIG. 41 illustrates an example, non-limiting device 4100 formed by growing semiconductor 620 between metal layer 140 and metal layer 2810. Device 4100 can comprise a cavity structure defined by metal layer 140, metal layer 2810, and a silicon layer (not shown) underlaying metal layer 2810. In an embodiment, metal layer 140, metal layer 2810, and the silicon layer each provide a sidewall of the cavity structure. FIG. 42 illustrates an example, non-limiting device 4200 formed by growing semiconductor 620 between metal layer 140 and metal layer 2810. Device 4200 can comprise a cavity structure defined by metal layer 140, metal layer 2810, and a silicon layer (not shown) underlaying metal layer 140. In an embodiment, metal layer 140, metal layer 2810, and the silicon layer each provide a sidewall of the cavity structure. FIG. 43 illustrates an example, non-limiting device 4300 formed by growing semiconductor 620 between metal layer 140, metal layer 2810, and metal layer 3710. Device 4300 can comprise a cavity structure defined by metal layer 140, metal layer 2810, metal layer 3710, and a silicon layer (not shown) underlaying metal layer 3710. In an embodiment, metal layer 140, metal layer 2810, metal layer 3710, and the silicon layer each provide a sidewall of the cavity structure.

Figure 44:
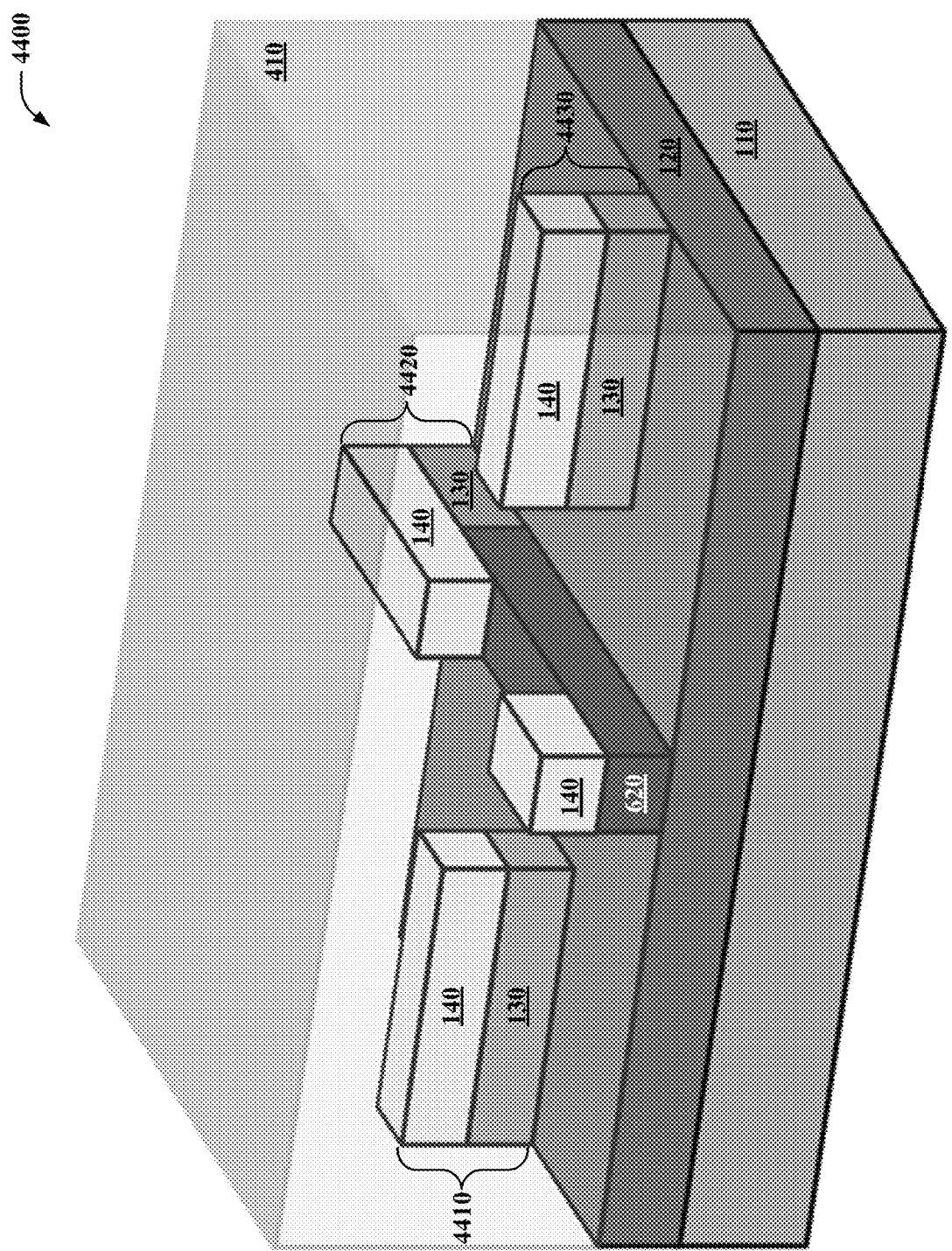
FIG. 44 illustrates a cross-sectional view of an example, non-limiting device with a high-transparency semiconductor-metal interface implemented with device structures patterned in a self-aligned manner, in accordance with one or more embodiments described herein.

FIG. 44 illustrates a cross-sectional view of an example, non-limiting device 4400 with a high-transparency semiconductor-metal interface implemented with structures patterned in a self-aligned manner, in accordance with one or more embodiments described herein. Device 4400 can comprise an example, non-limiting alternative embodiment of device 100 after removing portions of metal layer 140 and silicon layer 130 in a single step to form structure 4410, 4420, and 4430. As shown by FIG. 44, structure 4420 can comprise semiconductor 620 that is grown where a portion of silicon layer 130 was removed. In an embodiment, one or more of structures 4410-4430 can comprise a gate structure. For example, structure 4420 can comprise a back gate. As another example, structure 4410 and/or structure 4430 can comprise a split gate electrode. As another example, structure 4410 and/or structure 4430 can comprise a side gate electrode.

Semiconductor nanowires presented in embodiments of the present disclosure can be grown inside lateral cavities. Since the cavities can serve as templates that guide the semiconductor during growth, this mechanism was called template-assisted selective epitaxy (TASE). The templates can determine the geometry of the integrated semiconductor structures and play an integral role in the fabrication of devices having high-transparency semiconductor-metal interfaces. The dynamics of TASE semiconductor growth can be implemented in vertical and lateral $SiO_2$ templates. Embodiments disclosed herein can expand the capabilities of the TASE technology by integrating superconducting TiN segments into the template to facilitate hybrid superconductor-semiconductor devices. This approach is called hybrid-TASE. An overview of an example hybrid-TASE process flow is presented in FIGS. 45-50.

The fabrication of hybrid templates can be based on an 8-inch SOI wafer that can feature a BOX layer 4520 with a thin single-crystalline SOI layer 4530 on top. As shown by the example of FIG. 45, the SOI wafer can comprise a thin Si layer (e.g., SOI layer) 4530 separated from the Si substrate 4510 by a buried $SiO_2$ layer (e.g., BOX layer 4520) can be metallized with a 25 nm thick film of TiN 4540 to form device 4500 of FIG. 45. BOX layer 4520 can be 150 nm thick for all devices shown here. The thickness of the SOI layer 4530 can range from 40 nm to 70 nm.

The (110) orientation of the SOI layer used in this process flow can be different from the (001) orientation of the SOI layer generally used to implement lateral TASE semiconductor growth. Due to the lower symmetry of the (110) SOI layer used, the example process flow can laterally integrate III-V nanostructures in <001>, <110>, and <111> direction on a single chip, by utilizing the different growth dynamics in the respective directions. The SOI wafer can be metallized by sputtering of a 25 nm thick layer of TiN 4540. SOI/TiN bilayer nanowires can be patterned by dry etching of unprotected TiN and SOI regions in a single step to form device 4600 of FIG. 46. This can facilitate the TiN and SOI structures being self-aligned. As shown in FIG. 46, the self-aligned nanowire bilayer structures can be patterned into the TiN 4540 and SOI layers 4530. In FIG. 46, the nanowire terminates in a square. TiN 4540 can be selectively etched on this square, as shown in FIG. 47.

Figure 51:
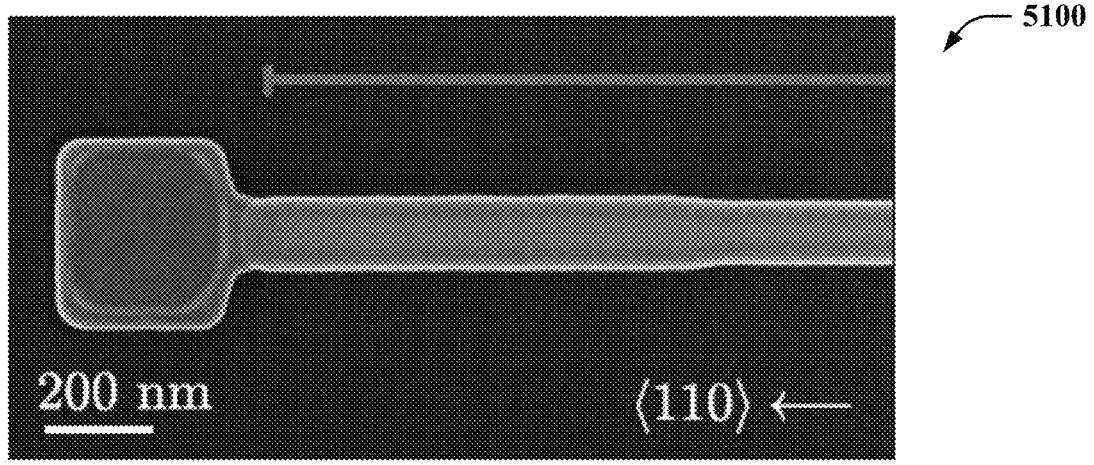
FIG. 51 illustrates an example, non-limiting top-view scanning electron microscope (SEM) micrograph depicting the device of FIG. 48, in accordance with one or more embodiments described herein.

In a selective etch step, the TiN layer 4540 can be partially removed on one end of the wire to form device 4700 of FIG. 47. The structure can be covered in a conformal 40 nm thick template $SiO_2$ layer 4810 which can be locally etched in the regions where the TiN layer 4540 was selectively removed before to form device 4800 of FIG. 48. This is illustrated in the top-view SEM micrograph 5100 of FIG. 51 that depicts device 4800. Selectively etching out the SOI nanowire structure creates hollow cavities 4910 with sidewalls of $SiO_2$ and TiN. Selective etching of the Si wire creates a cavity formed by the template $SiO_2$ and the stripe of TiN. A segment of Si remains at the end of the cavity. The length of the cavity can be determined by the etching time which is chosen such that a segment of Si remains at the end of the cavity to form device 4900 of FIG. 49. This is illustrated in the top-view SEM micrograph 5200 of FIG. 52 that depicts device 4900. The Si segment can act as a seed for the epitaxial growth of InAs nanowires, as illustrated in FIG. 50.

In the last step, an InAs nanowire 5010 can be grown inside the template structure via MOVPE to form device 5000 of FIG. 50. This is illustrated in the top-view SEM micrograph 5300 of FIG. 53 that depicts device 5000. The residual Si segment in the template can serve as the nucleation seed from which the InAs growth starts. For the InAs growth, the V/III material ratio can be tuned such that the nanowire radially fills the template, thereby creating an interface between the InAs semiconductor and the TiN superconductor. Consequently, the height of the nanowire can be determined by the thickness of the SOI layer 4530 (e.g., 40 nm to 70 nm), the lithographically defined width of the template (e.g., 40 nm to 100 nm) can set the nanowire width. The nanowire length can be typically 1 μm and tuned via the Si etch and InAs growth time. Owing to the different diffusion mechanisms of precursor species trimethylindium (TMIn) and tertbutylarsine (TBAs) inside the template the effective V/III ratio at the growth front can depend on the aspect ratio of the empty cavity 4910. Since the effective aspect ratio can change during growth not only can the effective V/III ratio change as a function of the nanowire length but also the growth rates of the {110} and {111}B facets. The nanowire InAs can exhibit distinct {111}B facets as it approaches the end of the template.

The following disclosure describes in greater detail the fabrication of templates with integrated TiN segments. In an embodiment, the wafer can be cleaned in concentrated piranha (sulfuric acid and hydrogen peroxide 2:1) followed by a rinse in ultrapure water and cleaning in a 600 watt (W) oxygen plasma. In an embodiment, a 3 nm SiO2 layer can be deposited via ALD in an oxygen plasma atmosphere in order to add a thin SiO2 layer on top of the native SiO2 formed by the etching steps. A 25 nm thick layer of TiN can be deposited on the wafer via DC reactive magnetron sputtering, as illustrated in FIG. 45.

Si/TiN bilayer nanostructures can be patterned via inductively coupled HBr plasma etching. For this purpose, a 50 nm thick mask of hydrogen silsesquioxane (HSQ) negative tone resist can be defined using electron-beam lithography at 100 kV. After etching of both the Si and the TiN layer, the HSQ mask can be removed in diluted hydrofluoric acid. Si/TiN wires that can be patterned in this fashion are generally 2 μm long and have a width ranging from 40 nm to 100 nm. This lithographically defined width can correspond to the minimum width of the InAs nanowires that are grown at a later stage. The Si/TiN wires can terminate in a square as shown in FIG. 46.

The Si/TiN wires can be encapsulated in a 5 nm $SiO_2$ layer deposited via oxygen plasma ALD in order to ensure adhesion of an 80 nm AR-P 6200.04 positive tone resist layer. Using electron-beam lithography, squares can be patterned on one end of the wires. The ALD grown $SiO_2$ layer can be etched in buffered hydrofluoric acid (BHF) and squares of TiN can be selectively removed in a wet-etch solution of $H_2O$, $H_2O_2$ and $NH_4OH$ (5:2:1) at 65° C. as illustrated in FIG. 47.

Figure 52:
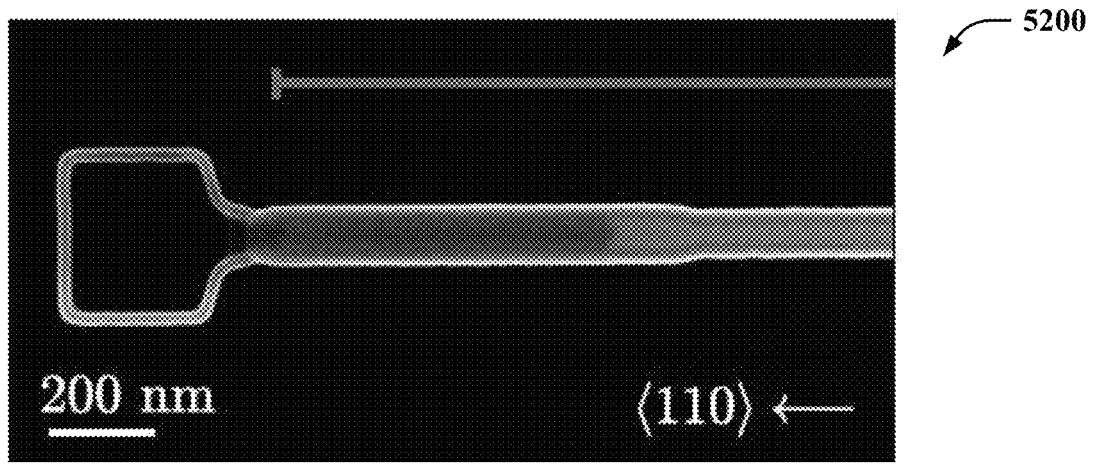
FIG. 52 illustrates an example, non-limiting top-view scanning electron microscope (SEM) micrograph depicting the device of FIG. 49, in accordance with one or more embodiments described herein.

The resist can be removed with organic solvents and a 40 nm layer of SiO2 can be grown using oxygen plasma ALD. This $SiO_2$ layer can guide the growth of III-V structures and is referred to as the SiO2 template. In order to reduce the etch rate of the SiO2 template, the devices can be annealed at 600° C. for 30 seconds. Using electron beam lithograph on an 80 nm layer of AR-P 6200.04 positive tone resist, openings can be defined on the areas where TiN was etched previously. The openings can be transferred into the $SiO_2$ template using reactive ion etching in $Ar/CHF_3$ atmosphere and BHF etching. In this way the Si square at the end of each wire can be exposed. In an embodiment, the exposed area should not overlap with the TiN stripe on top of the sacrificial Si wire, such that the TiN features remain protected by the template $SiO_2$. This situation is illustrated in FIG. 48. The exposed Si square can facilitate selectively etching the sacrificial Si structures, creating cavities formed by the template $SiO_2$ and TiN. The etching can be performed in a 2% tetramethylammonium hydroxide (TMAH) solution at 80° C. The length of the cavity can be determined by the etching time which can be chosen such that a segment of Si remains, as shown in FIG. 49. Due to the anisotropy of the etch, these Si segments exhibit typical {111} facets as seen in FIG. 52. They are oriented perpendicular to the (110) wafer surface.

The following disclosure details an example of InAs semiconductor growth inside a template cavity. Prior to MOVPE semiconductor growth the templates can be immersed in diluted hydrofluoric acid (DHF). This etch can serve two purposes as it removes both the SiO2 protection layer below the integrated TiN areas and etches native SiO2 from the Si {111} seed facets while creating hydrogen terminated facets. At the same time, the inner template dimensions can increase slightly during immersion in DHF. This effect can be seen in FIG. 54 where the InAs nanowire is approximately 20 nm wider than the TiN region.

After etching in DHF the chip can be transferred into a MOVPE growth reactor where it can be annealed at 600° C. under TBAs flow. $H_2$ can be used as a carrier gas and InAs growth can be initiated as TMIn is introduced into the reactor. InAs growth can be performed at a pressure of 60

Torr at temperatures of either 550° C. or 600° C. and V/III ratios between 70 and 150. Examples of typical growth times range from 40 min to 60 min. The length of nanowires grown in this way not only can depend on the growth conditions in the reactor but in particular can also depend on the aspect ratio and crystal orientation of the template as well as the area of exposed TiN present in the cavity. The template aspect ratio can be determined by the SOI thickness, the lithographically defined width of the template and the Si backetch length. InAs nanowires grown inside templates with a low aspect ratio (e.g., where the cavity cross-section can be approximately 90 nm×120 nm and the cavity length is 1 µm) can have a higher growth rate compared to wires in a high aspect template on the same chip. Typical devices with a high aspect ratio can feature a cross-section of 50 nm×50 nm and a length of more than 1 µm. As the effective length of the cavity decreases during growth, an acceleration of the growth rate can be observed as the growth front approaches the template opening.

The following disclosure details an example device contacting and gates. After InAs growth a double layer of PMMA 669.04 (300 nm) and AR-P 672.03 (100 nm) resist can be spun and device contacts can be patterned with electron beam lithography. After resist development in methyl isobutyl ketone (MIBK) and isopropanol (IPA) with ratio 1:2 the SiO2 template can be locally etched with BHF in the contact areas and now exposed InAs regions can be passivated by immersion in 2% ammonium sulfide solution prior to evaporation of Ti (10 nm) and Au (150 nm). After lift-off in dimethyl sulfoxide (DMSO) a single layer of AR-P 672.03 (100 nm) can be spun and gate structures can be patterned via electron beam lithography. The resist can be developed in MIBK:IPA (1:2) and layers of Ti (5 nm) and Au (20 nm) can be evaporated, lift-off can be performed in DMSO. The Si handle wafer can be used as an additional backgate. It can be contacted by etching native SiO2 in BHF and evaporation of Ti (5 nm) and Pt (40 nm). During this step devices on the chip can be protected by a 6.2 µm thick layer of optical resist.

Figure 54:
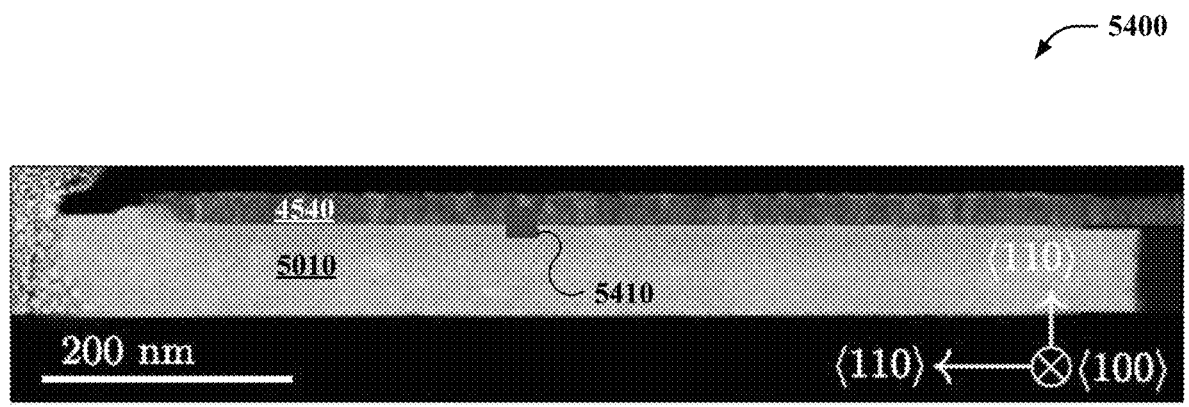
FIG. 54 illustrates an example, non-limiting cross-sectional view of the device of FIG. 50, in accordance with one or more embodiments described herein.
Figure 55:
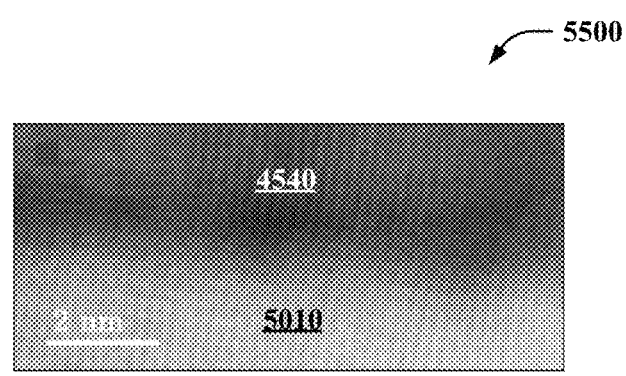
FIG. 55 illustrates an example, non-limiting close-up view depicting a high-transparency, semiconductor-metal interface within the cross-sectional view of FIG. 54, in accordance with one or more embodiments described herein.
Figure 56:
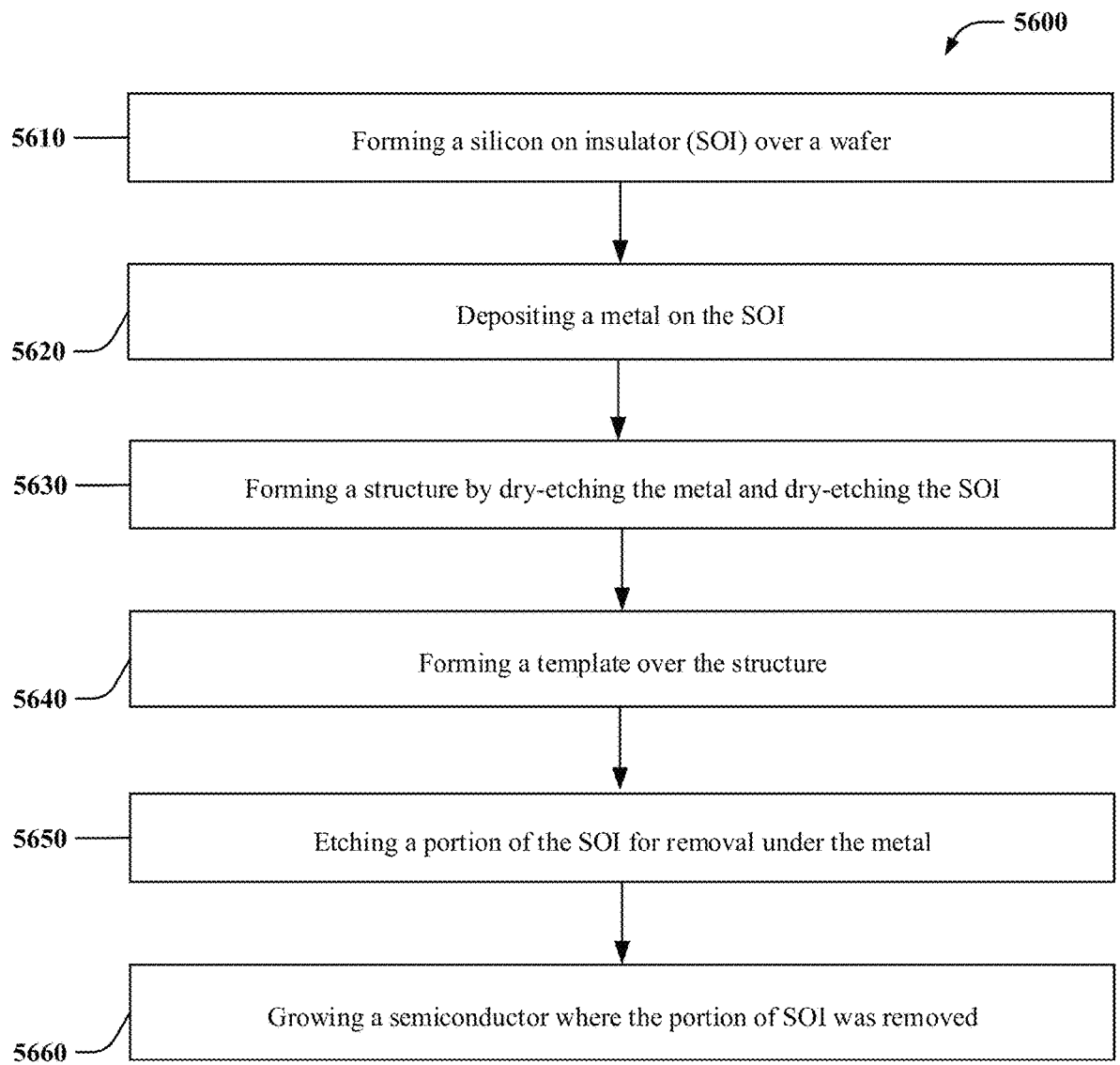
FIG. 56 illustrates a flow diagram of an example, non-limiting method that can facilitate high-transparency semiconductor-metal interfaces, in accordance with one or more embodiments described herein.

FIGS. 54-56 illustrate example, non-limiting TEM cross-sectional views of the device 5000 of FIG. 50 taken along line B-B, in accordance with one or more embodiments described herein. FIG. 54 illustrates a view 5400 depicting a high-transparency interface between a metal layer 5410 (e.g., TiN) and a semiconductor 5420 (e.g., InAs) formed in situ during growth of semiconductor 5420. FIG. 55 illustrates a closeup view 5500 depicting a region 5430 of the high-transparency interface between metal layer 5410 and semiconductor 5420 of FIG. 54. FIG. 56 illustrates a closeup view 5600 depicting a region 5440 of semiconductor 5420 from FIG. 54. As shown by FIG. 56, semiconductor 5420 can comprise a monocrystalline structure with no grain boundaries.

Figure 53:
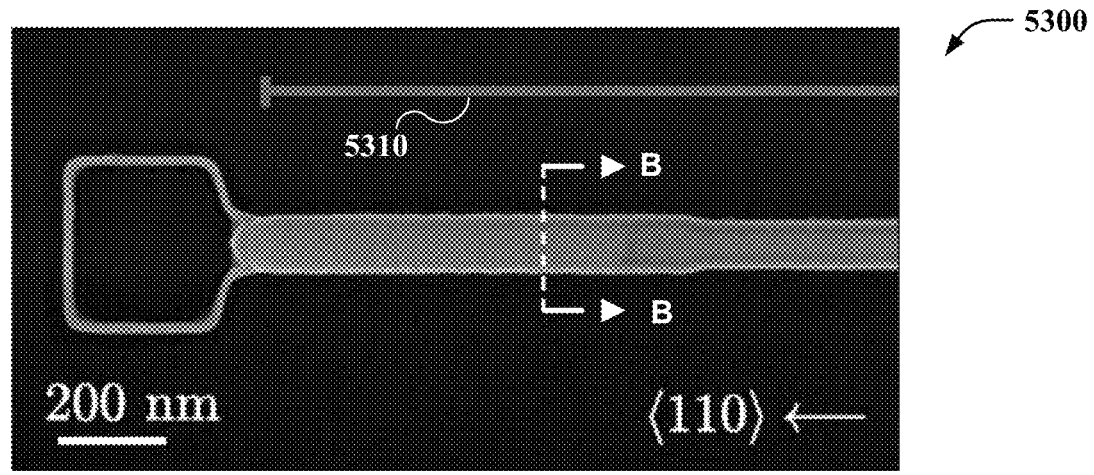
FIG. 53 illustrates an example, non-limiting top-view scanning electron microscope (SEM) micrograph depicting the device of FIG. 50, in accordance with one or more embodiments described herein.

FIGS. 54-55 illustrate example, non-limiting TEM cross-sectional views of the device 5000 of FIG. 50 taken from the perspective of line 5310 depicted in FIG. 53. FIG. 54 illustrates a view 5400 depicting the high-transparency interface between metal layer 4540 and semiconductor 5010 from the perspective of line 5310. FIG. 55 illustrates a closeup view 5500 depicting a region 5410 of the high-transparency interface between metal layer 4540 and semiconductor 5010 of FIG. 54.

FIG. 56 illustrates a flow diagram of an example, non-limiting method 5600 that can facilitate high-transparency semiconductor-metal interfaces, in accordance with one or more embodiments described herein. Repetitive description of like elements employed in other embodiments described herein is omitted for sake of brevity. At 5610, the method 5600 can comprise forming a SOI (e.g., silicon layer 130 of FIG. 1) over a wafer. At 5620, the method 5600 can comprise depositing a metal (e.g., metal layer 140 of FIG. 1) on the SOI. At 5630, the method 5600 can comprise forming a structure (e.g., structure 210 of FIG. 2) by dry-etching the metal and dry-etching the SOI. At 5640, the method 5600 can comprise forming a template over the structure. At 5650, the method 5600 can comprise etching a portion of the SOI (e.g., portion 520 of FIG. 5) for removal under the metal. At 5660, the method 5600 can comprise growing a semiconductor (e.g., semiconductor 620 of FIG. 6) where the portion of SOI was removed.

In an embodiment, the metal comprises: TiN, a superconductor, a non-superconductor, ferromagnetic metal, or a combination thereof. In an embodiment, the template determines a geometry of the semiconductor. In an embodiment, growing the semiconductor is implemented using MOVPE. In an embodiment, an interface between the metal and the semiconductor is formed in situ during growth of the semiconductor. In an embodiment, the method 5600 further comprises exposing the SOI using a hydrofluoric acid etch prior to etching the portion of the SOI for removal. In an embodiment, the method 5600 further comprises depositing a dielectric on the SOI prior to depositing the metal.

Figure 57:
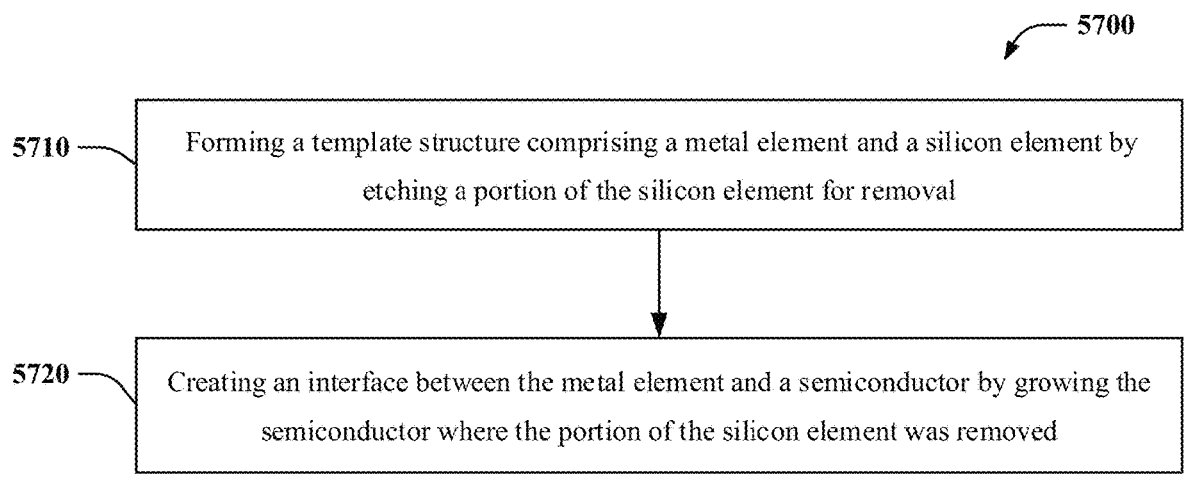
FIG. 57 illustrates a flow diagram of another example, non-limiting method that can facilitate high-transparency semiconductor-metal interfaces, in accordance with one or more embodiments described herein.

FIG. 57 illustrates a flow diagram of another example, non-limiting method that can facilitate high-transparency semiconductor-metal interfaces, in accordance with one or more embodiments described herein. Repetitive description of like elements employed in other embodiments described herein is omitted for sake of brevity. At 5710, the method 5700 can comprise forming a template structure comprising a metal element (e.g., metal layer 140 of structure 510 of FIG. 5) and a silicon element (e.g., silicon layer 130 of structure 510) by etching a portion (e.g., portion 520) of the silicon element for removal. At 5720, the method 5700 can comprise creating an interface between the metal element and a semiconductor (e.g., semiconductor 620 of FIG. 6) by growing the semiconductor where the portion of the silicon element was removed.

In an embodiment, the silicon element comprises: silicon-on-insulator, polycrystalline silicon, or a combination thereof. In an embodiment, a residual portion of the silicon element (e.g., silicon layer 130 of structure 610 of FIG. 6) that remains after the etching provides a nucleation seed from which growth of the semiconductor commences. In an embodiment, the semiconductor is a group III-V semiconductor. In an embodiment, the template structure further comprises a dielectric layer (e.g., dielectric layer 410 of FIG. 5) overlaying the metal element and the silicon element. In an embodiment, the silicon element comprises a (110) crystal orientation. In an embodiment, the template structure is formed on a silicon wafer. In an embodiment, the method 5700 can further comprise dry-etching a metal layer and a silicon layer in a single step to self-align the metal element and the silicon element.

Figure 58:
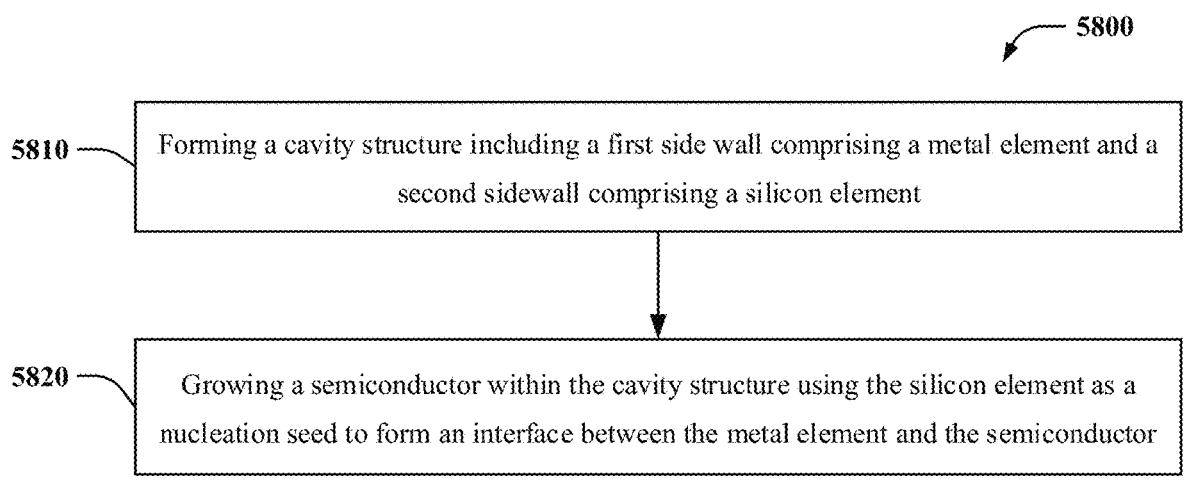
FIG. 58 illustrates a flow diagram of another example, non-limiting method that can facilitate high-transparency semiconductor-metal interfaces, in accordance with one or more embodiments described herein.

FIG. 58 illustrates a flow diagram of another example, non-limiting method that can facilitate high-transparency semiconductor-metal interfaces, in accordance with one or more embodiments described herein. Repetitive description of like elements employed in other embodiments described herein is omitted for sake of brevity. At 5810, the method 5800 can comprise forming a cavity structure including a first side wall comprising a metal element (e.g., metal layer 140 of structure 510 of FIG. 5) and a second sidewall comprising a silicon element (e.g., silicon layer 130 of structure 510). At 5820, the method 5800 can comprise growing a semiconductor (e.g., semiconductor 620 of FIG. 6) within the cavity structure using the silicon element as a nucleation seed to form an interface between the metal element and the semiconductor.

In an embodiment, the cavity structure overlays a silicon-on-insulator wafer. In an embodiment, forming the cavity structure comprises etching a portion (e.g., portion 520 of FIG. 5) of the silicon element for removal. In an embodiment, a length of the cavity structure corresponds with an etch time used to form the cavity structure. In an embodiment, a height of the semiconductor is determined by a thickness of a dielectric layer overlaying the cavity structure. In an embodiment, growth of the semiconductor is guided by one or more geometries of the cavity structure.

Figure 59:
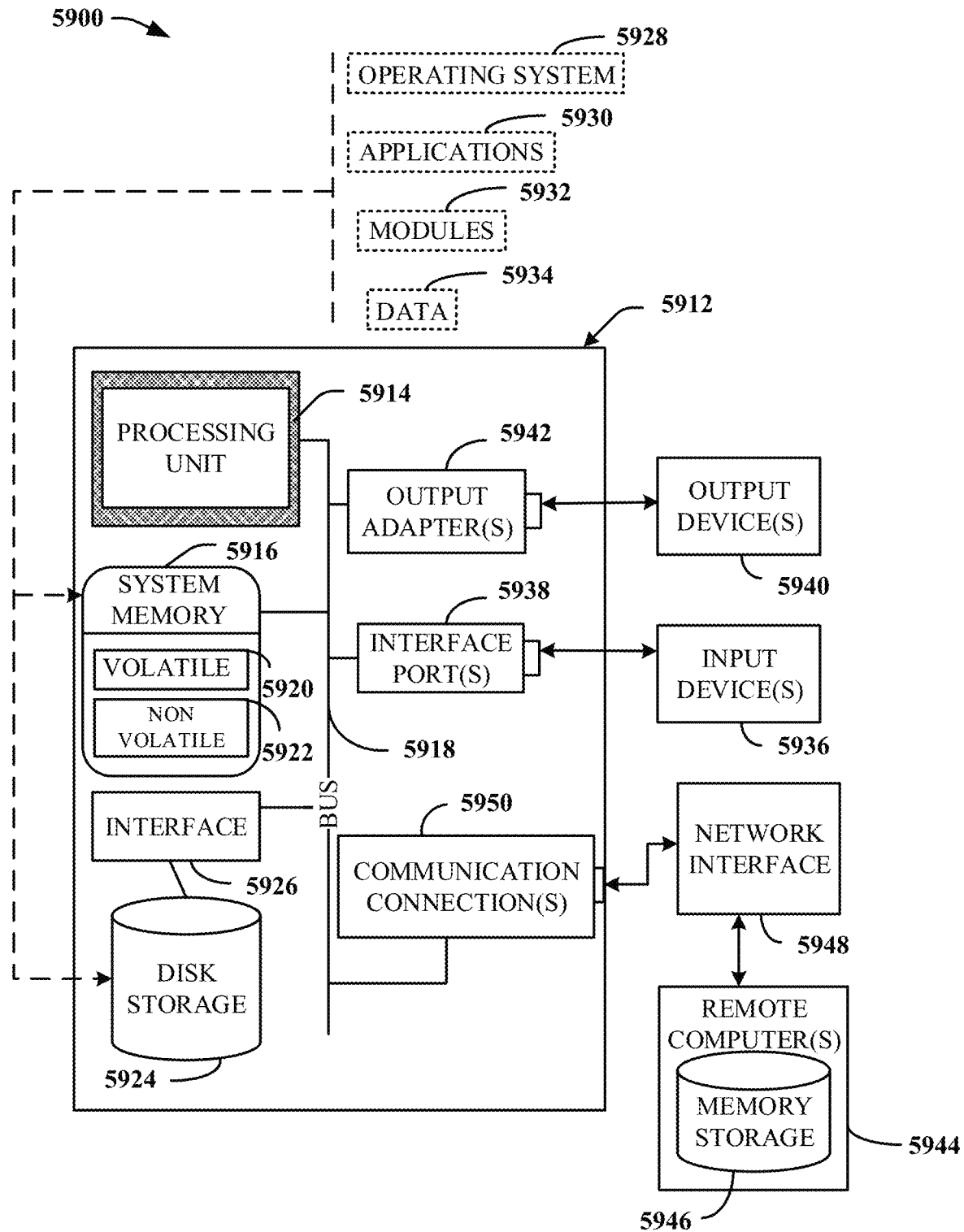
FIG. 59 illustrates a block diagram of an example, non-limiting operating environment in which one or more embodiments described herein can be facilitated.

In order to provide a context for the various aspects of the disclosed subject matter, FIG. 59 as well as the following discussion are intended to provide a general description of a suitable environment in which the various aspects of the disclosed subject matter can be implemented. FIG. 59 illustrates a suitable operating environment 5900 for implementing various aspects of this disclosure can also include a computer 5912. The computer 5912 can also include a processing unit 5914, a system memory 5916, and a system bus 5918. The system bus 5918 couples system components including, but not limited to, the system memory 5916 to the processing unit 5914. The processing unit 5914 can be any of various available processors. Dual microprocessors and other multiprocessor architectures also can be employed as the processing unit 5914. The system bus 5918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 5916 can also include volatile memory 5920 and nonvolatile memory 5922. The basic input/output system (BIOS), containing the basic routines to transfer information between elements within the computer 5912, such as during start-up, is stored in nonvolatile memory 5922. By way of illustration, and not limitation, nonvolatile memory 5922 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 5920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 5912 can also include removable/non-removable, volatile/non-volatile computer storage media. FIG. 59 illustrates, for example, a disk storage 5924. Disk storage 5924 can also include, but is not limited to, devices like a magnetic disk drive, floppy disk drive, tape drive, Jaz drive, Zip drive, LS-100 drive, flash memory card, or memory stick. The disk storage 5924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 5924 to the system bus 5918, a removable or non-removable interface is typically used, such as interface 5926. FIG. 59 also depicts software that acts as an intermediary between users and the basic computer resources described in the suitable operating environment 5900. Such software can also include, for example, an operating system 5928. Operating system 5928, which can be stored on disk storage 5924, acts to control and allocate resources of the computer 5912. System applications 5930 take advantage of the management of resources by operating system 5928 through program modules 5932 and program data 5934, e.g., stored either in system memory 5916 or on disk storage 5924. It is to be appreciated that this disclosure can be implemented with various operating systems or combinations of operating systems. A user enters commands or information into the computer 5912 through input device(s) 5936. Input devices 5936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 5914 through the system bus 5918 via interface port(s) 5938. Interface port(s) 5938 include, for example, a serial port, a parallel port, a game port, and a universal serial bus (USB). Output device(s) 5940 use some of the same type of ports as input device(s) 5936. Thus, for example, a USB port can be used to provide input to computer 5912, and to output information from computer 5912 to an output device 5940. Output adapter 5942 is provided to illustrate that there are some output devices 5940 like monitors, speakers, and printers, among other output devices 5940, which require special adapters. The output adapters 5942 include, by way of illustration and not limitation, video and sound cards that provide a means of connection between the output device 5940 and the system bus 5918. It can be noted that other devices and/or systems of devices provide both input and output capabilities such as remote computer(s) 5944.

Computer 5912 can operate in a networked environment using logical connections to one or more remote computers, such as remote computer(s) 5944. The remote computer(s) 5944 can be a computer, a server, a router, a network PC, a workstation, a microprocessor-based appliance, a peer device or other common network node and the like, and typically can also include many or the elements described relative to computer 5912. For purposes of brevity, only a memory storage device 5946 is illustrated with remote computer(s) 5944. Remote computer(s) 5944 is logically connected to computer 5912 through a network interface 5948 and then physically connected via communication connection 5950. Network interface 5948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 5950 refers to the hardware/software employed to connect the network interface 5948 to the system bus 5918. While communication connection 5950 is shown for illustrative clarity inside computer 5912, it can also be external to computer 5912. The hardware/software for connection to the network interface 5948 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming high-transparency semiconductor metal interfaces, the method comprising:
    forming a silicon on insulator (SOI) layer over a wafer;
    depositing a metal layer on the SOI layer;
    forming a structure by dry-etching away a portion of the metal layer resulting in a metal element and dry-etching away a portion of the SOI layer resulting in an SOI element;
    forming a template, wherein the template is distinct from the structure, the metal element and the SOI element;
    forming a cavity structure by etching a portion of the SOI element for removal under the metal layer; and
    creating an in-situ interface between the metal element and a semiconductor by growing the semiconductor where the portion of SOI element was removed, and wherein the semiconductor is a III-V semiconductor and the growing is performed after the forming the template, and the forming the cavity structure.

2. The method of claim 1, wherein the metal layer comprises: TiN, a superconductor, a non-superconductor, ferromagnetic metal, or a combination thereof.

3. The method of claim 1, further comprising:
    exposing the SOI layer using a hydrofluoric acid etch prior to etching the portion of the SOI layer for removal.

4. The method of claim 1, wherein the template determines a geometry of the semiconductor.

5. The method of claim 1, wherein the growing the semiconductor is implemented using metal-organic vapor phase epitaxy (MOVPE).

6. The method of claim 1, further comprising:
    depositing a dielectric on the SOI layer prior to depositing the metal layer.

7. A method of forming high transparency semiconductor metal interfaces, comprising:
    forming a silicon on insulator (SOI) layer over a wafer;
    depositing a metal layer on the SOI layer;
    forming a template structure comprising a metal element and a silicon element by dry-etching a portion of the metal layer and the SOI layer for removal, wherein the template structure comprises a template over the metal element and the silicon element; and
    creating an interface between the metal element and a semiconductor by growing the semiconductor where the portion of the SOI element was removed using residual SOI element as nucleation seed, and wherein the semiconductor is a group III-V semiconductor and the creating the interface by growing the semiconductor is performed after the forming the template structure.

8. The method of claim 7, wherein the silicon element comprises: silicon-on-insulator, polycrystalline silicon, or a combination thereof.

9. The method of claim 7, wherein the template structure further comprises a dielectric layer overlaying the metal element and the silicon element.

10. The method of claim 7, further comprising: the dry-etching the metal layer and the SOI layer in a single step to self-align the metal element and the silicon element.

11. The method of claim 7, wherein the silicon element comprises a (110) crystal orientation.

12. The method of claim 7, wherein the template structure is formed on a silicon wafer.

13. A method of forming high transparency semiconductor metal interfaces, comprising:
    forming a cavity structure including a first side wall comprising a first-metal layer, a second side wall comprising a second metal layer, opposite to the first side wall and a third side wall comprising a silicon on insulator (SOI) element between the first side wall and the second side wall;
    wherein forming the cavity structure comprises:
    etching a portion of the SOI element for removal;
    growing a semiconductor within the cavity structure using residual SOI element as a nucleation seed to form an interface between the first metal layer, the second metal layer and the semiconductor;
    wherein the cavity structure has the first metal layer and the second metal layer integrated with in the cavity structure prior to the growing the semiconductor.

14. The method of claim 1, wherein a length of the cavity structure corresponds with an etch time used to form the cavity structure.

15. The method of claim 1, wherein a height of the semiconductor is determined by a thickness of the dielectric layer overlaying the cavity structure.

16. The method of claim 1, wherein growth of the semiconductor is guided by one or more geometries of the cavity structure.

* * * * *